(12) United States Patent
Gardner

(10) Patent No.: US 7,791,447 B2
(45) Date of Patent: Sep. 7, 2010

(54) INTEGRATED TRANSFORMER

(75) Inventor: Donald S. Gardner, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/238,418

(22) Filed: Sep. 25, 2008

(65) Prior Publication Data

US 2009/0015363 A1    Jan. 15, 2009

Related U.S. Application Data

(60) Continuation of application No. 10/965,086, filed on Oct. 13, 2004, now Pat. No. 7,434,306, which is a division of application No. 10/637,428, filed on Aug. 8, 2003, now Pat. No. 6,943,658, which is a division of application No. 10/230,580, filed on Aug. 29, 2002, now Pat. No. 6,856,226, which is a division of application No. 09/853,370, filed on May 11, 2001, now Pat. No. 6,870,456, which is a continuation-in-part of application No. 09/766,162, filed on Jan. 19, 2001, now Pat. No. 6,856,228, which is a continuation-in-part of application No. 09/444,608, filed on Nov. 23, 1999, now Pat. No. 6,452,247.

(51) Int. Cl.
    *H01F 5/00*     (2006.01)
(52) U.S. Cl. .................................... 336/200
(58) Field of Classification Search ............... 336/65, 336/83, 200, 232; 257/531
    See application file for complete search history.

(56) References Cited

U.S. PATENT DOCUMENTS

| | | |
|---|---|---|
| 3,607,462 A | 9/1971 | Liang et al. |
| 3,881,244 A | 5/1975 | Kendall |
| 3,905,883 A | 9/1975 | Hanazono et al. |
| 4,543,553 A | 9/1985 | Mandai et al. |
| 4,791,719 A | 12/1988 | Kobayashi et al. |
| 4,797,648 A | 1/1989 | Kaneko et al. |
| 4,816,784 A | 3/1989 | Rabjohn |
| 4,884,156 A | 11/1989 | Miyakawa et al. |
| 4,959,631 A | 9/1990 | Hasegawa et al. |

(Continued)

FOREIGN PATENT DOCUMENTS

DE    411787    12/1991

(Continued)

OTHER PUBLICATIONS

Baba, M. et al., "GHz-Drive Magnetic Thin-Film Inductor Using CoNbZr Film," Journal of the Magnetics Society of Japan, vol. 24, No. 4-2, pp. 879-882, 2000.

(Continued)

*Primary Examiner*—Tuyen Nguyen
(74) *Attorney, Agent, or Firm*—Blakely, Sokoloff, Taylor & Zafman LLP

(57) ABSTRACT

A transformer comprises a substrate comprising a semiconductor material, a first conductor over the substrate, a second conductor over the substrate, and a magnetic layer over the substrate. The first conductor defines a generally spiral-shaped signal path having at least one turn. The second conductor defines a generally spiral-shaped signal path having at least one turn.

6 Claims, 13 Drawing Sheets

U.S. PATENT DOCUMENTS

| | | | |
|---|---|---|---|
| 5,047,296 | A | 9/1991 | Miltenberger et al. |
| 5,095,357 | A | 3/1992 | Andoh et al. |
| 5,097,243 | A * | 3/1992 | Zieren et al. ............... 505/211 |
| 5,121,852 | A | 6/1992 | Wilkes |
| 5,169,713 | A | 12/1992 | Kumurdjian |
| 5,221,459 | A | 6/1993 | Okano et al. |
| 5,420,558 | A | 5/1995 | Ito et al. |
| 5,446,311 | A | 8/1995 | Ewen et al. |
| 5,469,399 | A | 11/1995 | Sato et al. |
| 5,530,415 | A | 6/1996 | Takaya et al. |
| 5,548,265 | A * | 8/1996 | Saito .......................... 336/200 |
| 5,583,474 | A | 12/1996 | Mizoguchi et al. |
| 5,609,946 | A | 3/1997 | Korman et al. |
| 5,635,892 | A | 6/1997 | Ashby et al. |
| 5,694,030 | A | 12/1997 | Sato et al. |
| 5,705,287 | A | 1/1998 | Doerner et al. |
| 5,781,071 | A | 7/1998 | Kusunoki |
| 5,801,100 | A | 9/1998 | Lee et al. |
| 5,834,825 | A | 11/1998 | Imai |
| 5,877,533 | A | 3/1999 | Arai et al. |
| 5,892,425 | A | 4/1999 | Kuhn et al. |
| 5,930,415 | A | 7/1999 | Pham |
| 5,952,704 | A | 9/1999 | Yu et al. |
| 5,961,746 | A | 10/1999 | Nepela |
| 5,976,715 | A | 11/1999 | Chen et al. |
| 6,031,445 | A | 2/2000 | Marty et al. |
| 6,033,782 | A | 3/2000 | Hubbard et al. |
| 6,037,649 | A | 3/2000 | Liou |
| 6,040,226 | A | 3/2000 | Wojnarowski et al. |
| 6,067,002 | A | 5/2000 | Fujino et al. |
| 6,103,136 | A | 8/2000 | Han et al. |
| 6,114,937 | A | 9/2000 | Burghartz et al. |
| 6,121,852 | A | 9/2000 | Mizoguchi et al. |
| 6,166,422 | A | 12/2000 | Qian et al. |
| 6,191,495 | B1 | 2/2001 | Kossives et al. |
| 6,201,287 | B1 | 3/2001 | Forbes |
| 6,207,303 | B1 | 3/2001 | Tomita |
| 6,240,621 | B1 | 6/2001 | Nellissen et al. |
| 6,281,560 | B1 | 8/2001 | Allen et al. |
| 6,291,305 | B1 | 9/2001 | Huang et al. |
| 6,404,317 | B1 | 6/2002 | Mizoguchi et al. |
| 6,441,715 | B1 | 8/2002 | Johnson |
| 6,593,841 | B1 | 7/2003 | Mizoguchi et al. |

FOREIGN PATENT DOCUMENTS

| | | |
|---|---|---|
| EP | 0 295 028 A1 | 12/1988 |
| EP | 0 725 407 A1 | 8/1996 |
| EP | 0 884 783 A2 | 12/1998 |
| JP | 61-020311 | 1/1986 |
| JP | 03-21441 A | 1/1991 |
| JP | 5-81615 A | 4/1993 |
| JP | 06-124843 | 5/1994 |
| JP | 07-272932 | 10/1995 |
| TW | ROC 378417 | 1/2000 |
| TW | ROC 386310 | 4/2000 |
| TW | ROC 411481 | 11/2000 |
| WO | WO 01/39220 A1 | 5/2001 |
| WO | WO 02/058140 | 7/2002 |
| WO | WO 02/065492 | 8/2002 |
| WO | WO 02/171456 | 9/2002 |

OTHER PUBLICATIONS

Brandon, Erik et al., "Microinductors for Spacecraft Power Electronics," Magnetic Materials, Processes, and Devices VI Applications to Storage and Microelectromechanical Systems (MEMS), 2001, pp. 559-567, vol. 2000-29, The Electrochemical Society, Inc., Pennington, New Jersey.

Brandon, Erik "Passive Componenets for Systems-on-a-Chip Applications," Center for Integrated Space Microsystems, Jet Propulsion Laboratory.

Brandon, Erik "System on a Chip Integrated Passive Components (uIRS)".

Burghartz, Joachim N. "Integrated Multilayer RF Passives in Silicon Technology," IBM Research Division, T.J. Watson Research Center, Rte 134/Taconic Pkwy, Yorktown, Heights, New York 10598, USA.

Burghartz, Joachim N. "Progress in RF Inductors on Silicon—Understanding Substrate Losses," IBM Research Division, T.J. Watson Research Center, Rte 134/Taconic Pkwy, Yorktown, Heights, New York 10598, USA.

Fessant, A. et al., "Influence of In-Plane Anisotropy and Eddy Currents on the Frequency Spectra of the Complex Permeability of Amorphous CoZr Thin Films," IEEE Transactions of Magnetics, Jan. 1993, pp. 82-87, vol. 29, No. 1.

Gardner, Donald et al., "High Frequency (GHz) and Low Resistance Integrated Inductors Using Magnetic Materials," IEEE 2001, Intel Corporation, Components Research, Santa Clara, CA Department of Materials Science and Engineering, Stanford University, 3 pages.

Gardner, Donald S. et al., "Mechanical Stress as a Function of Temperature for Aluminum Alloys Films," Journal of Applied Physics, Feb. 15, 1990, pp. 1831-1845, vol. 67.

Kobayashi, Y. et al., "New Type Micro Cloth-Inductor and Transformer with Thin Amorphous Wires and Multi-Thin Coils," IEEE Transactions on Magnetics, Sep. 1992, pp. 3012-3014, vol. 28, No. 5.

Korenivski, V. et al., "Magnetic Film Inductors for Radio Frequency Applications," Journal of Applied Physics, Nov. 15, 1997, pp. 5247-5254, vol. 82.

Long, John R. et al., "The Modeling, Characterization, and Design of Monolithic Inductors for Silicon RF IC's," IEEE Journal of Solid-State Circuits, Mar. 1997, pp. 357-369, vol. 32, No. 3.

Matsuki, H. et al., "A New Cloth Inductor Using Amorphous Fiber," IEEE Transactions on Magnetics, Sep. 1985, pp. 1738-1740, vol. MAG-21, No. 5.

Mohan, Sunderarajan S. et al., "Bandwith Extension in CMOS with Optimized On-Chip Inductors," IEEE Journal of Solid-State Circuits, Mar. 2000, pp. 346-355, vol. 35, No. 3.

Mohan, Sunderarajan S. et al., "Modeling and Characterization of On-Chip Transformers," Center for Integrated Systems, Stanford University, Stanford, CA 94305.

Mohan, Sunderarajan S. et al., "Simple Accurate Expressions for Planar Spiral Inductances," IEEE Journal of Solid-State Circuits, Oct. 1999, pp. 1419-1424, vol, 34, No. 10.

Mojarradi, Mohammad M. et al., "Power Management and Distribution for System on a Chip for Space Applications," Jet Propulsion Laboratory, California Institute of Technology, Pasadena, CA, Harry Li, University of Idaho and Benjamin Blalock Mississippi State University, Paper No. 284.

Niknejad, Ali M. et al., "Analysis, Design, and Optimization of Spiral Inductors and Transformers for Si RF IC's," IEEE Journal of Solid-State Circuits, Oct. 1998, pp. 1470-1481, vol. 33, No. 10.

O'Donnel, Terence et al., "Microtransformers and Inductors Using Permalloy Thin Films," Preparation, Properties, and Applciations of Thin Ferromagnetic Films, Jun. 2000, pp. 45-52.

Oshiro, O. et al., "A Novel Miniature Planar Inductor," IEEE Transactions on Magnetics, vol. Mag-23, No. 5, Sep. 1987, Copyright 1987 IEEE pp. 3759-3761.

Park, Jae et al, Magnetic Devices Research: "Bar-Type Microinductor and Microtransformers with Electroplated Alloy Cores," "Batch-Fabricated Microinductors with Electroplated Magnetically Anisotropic and Laminated Alloy Cores," "Packagin-Compatible Micromagnetic Devices Using Screen-Printed Polymer/Ferrite Composites," "Packaging-Compatible High Q Microinductors and Microfilters for Wireless Applications," "Microrelay".

Park, Jae Yeong et al., "Batch-Fabricated Microinductors with Electroplated Magnetically Anisotropic and Laminated Alloy Cores," IEEE Transactions on Magnetics, Sep. 1999, pp. 4291-4300, vol. 35, No. 5.

PCT International Search Report for PCT/US02/01742, mailed Oct. 18, 2002, 8 pages (P11265PCT).

PCT Notification of Transmittal of International Preliminary Report for PCT/US02/01742, mailed Aug. 28, 2003, 4 pages.

PCT Written Opinion for PCT/US02/01742, mailed May 15, 2003, 4 pages.

Sato, T. et al., "New Applications of Nanocrystalline Fe(Co-Fe)-Hf-O Magnetic Films to Micromagnetic Devices," Journal of Applied Physics, Jun. 1, 1998, pp. 6658-6660, vol. 83, No. 11.

Shirakawa, K. et al., "Thin Film Cloth-Structured Inductor for Magnetic Integrated Circuit," IEEE Transactions on Magnetics, Sep. 1990, pp. 2262-2264, vol. 26, No. 5.

Tomita, H. et al., "Oblique-Field Annealing Effect for In-Plane Magnetic Anistropy of Soft Magnetic CO-N-B-ZR Thin Films," IEEE Transactions on Magentics, pp. 1336-1339, May 30, 1994, vol. 30, No. 30, IEEE, Inc., New York.

Yabukami, S. et al., "Noise Analysis of a MHz-3 GHz Magnetic Thin Film Permeance Meter," Journal of Applied Physics, Apr. 15, 1999, pp. 5148-5150, vol. 85, No. 8.

Yamaguchi, M. et al., "Characteristics of Magnetic Thin-Film Inductors at Large Magnetic Field," IEEE Transactions onf Magnetics, Nov. 1995, pp. 4229-4231, vol. 31, No. 6.

Yamaguchi, M. et al., "Magnetic Thin-Film Inductor for RF Integrated Circuits," Extended Abstracts of the 1999 International Conference on Solid-State Devices and Materials, 1999, pp. 580-281, Tokyo.

Yamaguchi, M. et al., "MGHz-Drive Magnetic Thin-Film Inductors for RF Integrated Circuits Using Micro-Patterned Granular Film," IEEE, 1990.

Yamaguchi, M. et al., "Microfabrication and Characteristics of Magnetics Thin-Film Inductors in the Ultrahigh Frequency Region," Journal of Applied Physics, Jun. 1, 1999, pp. 7919-7922, vol. 85, No. 11.

Yamaguchi, Masahiro "Magnetic Films for Planar Inductive Components and Devices," Handbook of Thin Film Devices, edited by M.H. Francombe, 2000, pp. 185-186, vol. 4: Magnetic Thin Film Devices.

Yue, C. Patrick et al., "On-Chip Spiral Inductors with Patterned Ground Shields for Si-Based RF IC's," IEEE Journal of Solid-State Circuits, May 1998, pp. 743-752, vol. 33, No. 5.

* cited by examiner

INTEGRATED TRANSFORMER

This patent application is a continuation patent application of a prior application No. 10/965,086 filed Oct. 13, 2004, issued as U.S. Pat. No. 7,434,306, which is a divisional of prior application No. 10/637,428 filed Aug. 8, 2003, issued as U.S. Pat. No. 6,943,658; which is a divisional of prior application No. 10/230,580, filed Aug. 29, 2002, issued as U.S. Pat. No. 6,856,226; which is a divisional of prior application No. 09/853,370 filed May 11, 2001, issued as U.S. Pat. No. 6,870,456; which is a continuation-in-part patent application of U.S. patent application Ser. No. 09/766,162, filed Jan. 19, 2001, entitled INTEGRATED INDUCTOR, by Donald S. Gardner, issued as U.S. Pat. No. 6,856,228; which is a continuation-in-part patent application of U.S. patent application Ser. No. 09/444,608, filed Nov. 23, 1999, entitled METHOD AND APPARATUS FOR PROVIDING INDUCTOR FOR INTEGRATED CIRCUIT OR INTEGRATED CIRCUIT PACKAGE, by Donald S. Gardner, issued as U.S. Pat. No. 6,452,247.

BACKGROUND OF THE INVENTION

1. Field of the Invention

The present invention relates generally to the field of electrical transformers. More particularly, the present invention relates to the field of electrical transformers for integrated circuits (ICs) and IC packages.

2. Description of Related Art

Electrical transformers are typically used in a variety of microelectronic circuit applications such as, for example, power converters, power delivery devices, power isolation devices, and radio frequency (RF) and microwave circuitry including matching networks, oscillators, amplifiers, and filters. Because discrete transformers result in losses, for example, due to parasitic capacitance and resistance in connecting them to an integrated circuit and because discrete transformers incur a relatively high cost for assembly, transformers are preferably fabricated on-chip; that is, integrated on an integrated circuit, and/or in a package housing an integrated circuit.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for an integrated transformer. In the following description, details are set forth such as specific materials, parameters, etc. in order to provide a thorough understanding of the present invention. It will be evident, however, that the present invention may be practiced without these details. In other instances, well-known process steps, equipment, etc. have not been described in particular detail so as not to obscure the present invention.

Spiral Inductor Structure

Figure 1:
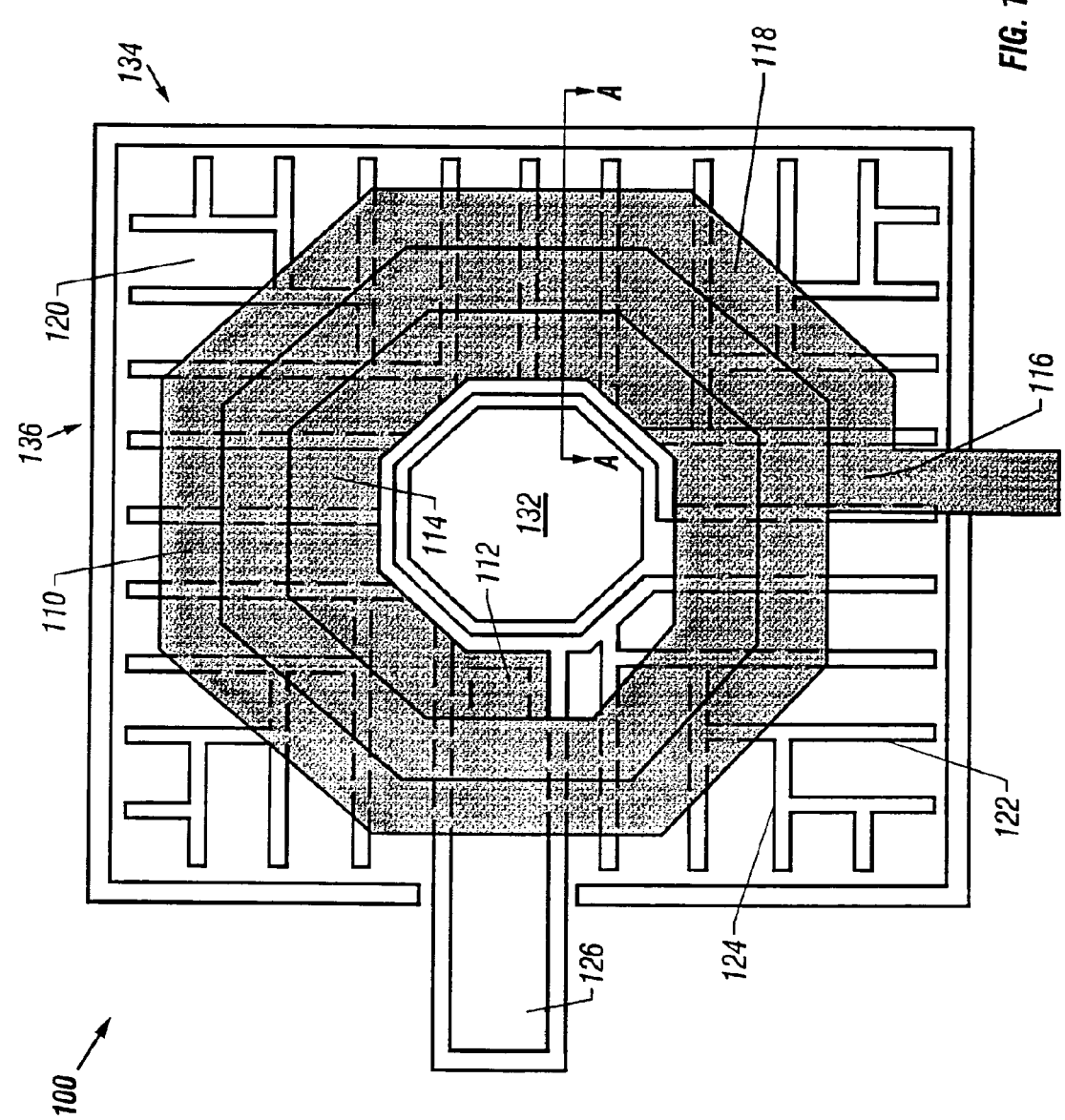
FIG. 1 illustrates, for one embodiment, a plan view of an integrated inductor.

FIG. 1 illustrates, for one embodiment, an integrated inductor 100. Integrated inductor 100 comprises a generally spiral-shaped conductor 110 defining a signal path along which current may flow to generate an electromagnetic field around conductor 110. Current may flow through conductor 110 by applying a voltage potential across an innermost node 112 near the beginning of an innermost turn 114 of conductor 110 and an outermost node 116 near the end of an outermost turn 118 of conductor 110.

Although illustrated as defining approximately 2¾ generally octagonal-shaped turns, conductor 110 may define any suitable number of one or more turns and any suitable fraction of a turn of any suitable shape. Each turn may be rectangular, hexagonal, or circular in shape, for example. Conductor 110 may comprise any suitable conductive material and may have any suitable dimensions. The signal path defined by conductor 110 may have any suitable width, thickness, and length with any suitable spacing between turns to form a generally spiral-shaped conductor 110 covering an area of any suitable shape and size. As used in this description, a spiral or spiral-shaped conductor includes any conductor defining a signal path having at least one turn with each successive turn, if any, substantially surrounding the innermost turn and any preceding turn.

Inductor 100 for one embodiment comprises a magnetic layer 120. Conductor 110 is positioned over magnetic layer 120 and for one embodiment is separated from magnetic layer

120 by at least a dielectric layer. Such a dielectric layer may comprise any suitable dielectric material and have any suitable thickness. The dielectric material and thickness help determine the capacitance and therefore the resonance frequency $\omega_r$ for inductor 100. Magnetic layer 120 forms a voltage reference plane for inductor 100 to help contain electric and magnetic fields around conductor 110. Magnetic layer 120 therefore helps increase the inductance L of inductor 100, and therefore the quality factor Q for inductor 100. Magnetic layer 120 may comprise any suitable magnetic material and have any suitable shape, such as the rectangular shape illustrated in FIG. 1 for example, and any suitable dimensions.

Inductor 100 may be designed to have any suitable frequency range and any desirable quality factor $Q \propto \omega L/R$, where $\omega$ is the operating frequency for inductor 100, L is the inductance of inductor 100, and R is the resistance of inductor 100. As the quality factor Q of inductor 100 is proportional to the inductance L of inductor 100 and inversely proportional to the resistance R of inductor 100, inductor 100 can be designed with a relatively higher inductance L, and therefore a relatively higher quality factor Q, for a given area or resistance R of inductor 100. Alternatively, for a given inductance L, inductor 100 can be designed with a relatively smaller area and therefore a relatively lower resistance R and capacitance, resulting in a relatively higher resonance frequency $\omega_r$ and a relatively higher quality factor Q.

Inductor 100 for one embodiment is formed over a substrate comprising a semiconductor material with at least a dielectric layer separating magnetic layer 120 from the substrate. Such a dielectric layer may comprise any suitable dielectric material and have any suitable thickness. As conductor 110 generates a magnetic flux toward the substrate that would induce Eddy or mirror currents and therefore losses in inductor 100 and noise in the substrate, positioning magnetic layer 120 between the substrate and conductor 110 helps reduce such currents and minimizes concern for interference between inductor 100 and neighboring circuitry. Magnetic layer 120 also helps prevent substrate coupling and helps reduce substrate dependency.

Magnetic layer 120 for one embodiment defines slots, such as slots 122 and 124 for example, to help further reduce any Eddy currents in the substrate. Magnetic layer 120 may define any suitable number of one or more slots with any suitable dimensions and orientation at any suitable one or more locations relative to conductor 110. One or more slots may be perpendicular to or at any other suitable angle relative to the flow of current through conductor 110. Defining slots in magnetic layer 120 also reduces Eddy currents that can form in magnetic layer 120 and helps to increase the resonance frequency $\omega_r$ for inductor 100.

Magnetic layer 120 for one embodiment has a relatively high magnetic permeability, a relatively high saturation magnetization, and a relatively high magnetic resonance frequency to allow inductor 110 to operate at relatively high frequencies, such as in the GigaHertz (GHz) range for example. Permeability is a measure of the ability of a magnetic material to magnetize. A non-magnetic material has a relative permeability of one. A magnetic material having a relatively high saturation magnetization allows for relatively high currents to be used. The increase in inductance L due to magnetic layer 120 helps increase the quality factor Q for inductor 100.

Magnetic layer 120 for one embodiment is compatible with available semiconductor processing and packaging technology that may be used to form a chip having inductor 100. That is, magnetic layer 120 may be formed and optionally patterned using available semiconductor processing technology and may generally withstand relatively high temperatures encountered in processing and packaging a chip on which inductor 100 is formed without crystallizing or significantly changing the relevant properties of magnetic layer 120.

Magnetic layer 120 for one embodiment comprises cobalt (Co). Magnetic layer 120 for one embodiment comprises an amorphous cobalt (Co) alloy comprising cobalt (Co) and any suitable one or more elements of any suitable atomic or weight percentage. The amorphous cobalt (Co) alloy may have any suitable atomic order. For one embodiment, the amorphous cobalt (Co) alloy has an atomic order in the range of approximately 1 angstrom (Å) to approximately 100 angstroms (Å). For one embodiment, the amorphous cobalt (Co) alloy has an atomic order in the range of approximately 1 angstrom (Å) to approximately 25 angstroms (Å). For one embodiment, the amorphous cobalt (Co) alloy has an atomic order in the range of approximately 1 angstrom (Å) to approximately 10 angstroms (Å).

Magnetic layer 120 for one embodiment comprises an amorphous cobalt (Co) alloy comprising cobalt (Co) and zirconium (Zr). Zirconium (Zr) helps make cobalt (Co) amorphous. Magnetic layer 120 for one embodiment comprises a cobalt-zirconium (CoZr) alloy having one or more additional elements, such as tantalum (Ta) and niobium (Nb) for example, that help make the cobalt-zirconium (CoZr) alloy magnetically softer. Magnetic layer 120 for one embodiment comprises a cobalt-zirconium (CoZr) alloy having one or more additional elements, such as a rare earth element for example, that help increase the ferromagnetic resonance of the cobalt-zirconium (CoZr) alloy. Rare earth elements include rhenium (Re), neodymium (Nd), praseodymium (Pr), and dysprosium (Dy) for example. Rhenium (Re) help reduce stress and magnetostriction for the cobalt-zirconium (CoZr) alloy.

Where magnetic layer 120 comprises a cobalt-zirconium (CoZr) alloy, magnetic layer 120 may comprise, for example, approximately 3 atomic percent to approximately 10 atomic percent zirconium (Zr).

Where magnetic layer 120 comprises a cobalt-zirconium-tantalum (CoZrTa) alloy, magnetic layer 120 may comprise, for example, approximately 3 atomic percent to approximately 10 atomic percent zirconium (Zr) and may comprise up to and including approximately 10 atomic percent tantalum (Ta). Magnetic layer 120 for one embodiment comprises approximately 91.5 atomic percent cobalt (Co), approximately 4 atomic percent zirconium (Zr), and approximately 4.5 atomic percent tantalum (Ta). Such a CoZrTa alloy can operate in the GigaHertz (GHz) range and can withstand temperatures up to approximately 450° Celsius without crystallizing or significantly changing its relevant properties.

Where magnetic layer 120 comprises a cobalt-zirconium-rhenium (CoZrRe) alloy, magnetic layer 120 may comprise, for example, approximately 3 atomic percent to approximately 10 atomic percent zirconium (Zr) and may comprise up to and including approximately 3 atomic percent rhenium (Re). Magnetic layer 120 for one embodiment comprises approximately 89 atomic percent cobalt (Co), approximately 8 atomic percent zirconium (Zr), and approximately 3 atomic percent rhenium (Re).

Magnetic layer 120 may have any suitable thickness. Magnetic layer 120 for one embodiment has a thickness in the range of approximately 0.05 microns (μm) to approximately 2.0 microns (μm). Magnetic layer 120 for one embodiment has a thickness in the range of approximately 0.1 microns (μm) to approximately 1.0 micron (μm). Magnetic layer 120 for one embodiment has a thickness of approximately 0.4 microns (μm).

Inductor 100 for one embodiment comprises another magnetic layer positioned over conductor 110 and separated from conductor 110 by at least a dielectric layer. Such a dielectric layer may comprise any suitable dielectric material and have any suitable thickness. The dielectric material and thickness help determine the capacitance and therefore the resonance frequency $\omega_r$ of inductor 100. The other magnetic layer may comprise any suitable magnetic material and have any suitable shape and dimensions similarly as for magnetic layer 120. The other magnetic layer may or may not comprise the same magnetic material as magnetic layer 120. The other magnetic layer helps further increase the inductance L of inductor 100, and therefore the quality factor Q for inductor 100, when used with magnetic layer 120.

The other magnetic layer for one embodiment defines slots to help reduce Eddy currents and increase the resonance frequency $\omega_r$ for inductor 100. The other magnetic layer may define any suitable number of one or more slots with any suitable dimensions and orientation at any suitable one or more locations relative to conductor 110. One or more slots may be perpendicular to or at any other suitable angle relative to the flow of current through conductor 110.

Inductor 100 may optionally comprise both magnetic layer 120 and the other magnetic layer or only either one of the two magnetic layers. For one embodiment where inductor 100 comprises both magnetic layer 120 and the other magnetic layer, magnetic layer 120 and the other magnetic layer may be connected through a region 132 within innermost turn 114 of conductor 110 and/or at one or more regions, such as regions 134 and 136 for example, along a perimeter surrounding outermost turn 118 of conductor 110. Connecting magnetic layer 120 and the other magnetic layer helps increase the inductance L of inductor 100 and therefore the quality factor Q for inductor 100. Magnetic layer 120 and the other magnetic layer may be connected along a perimeter of any suitable shape, such as the rectangular shape illustrated in FIG. 1 for example. Connecting magnetic layer 120 and the other magnetic layer at most or substantially all regions along a perimeter surrounding conductor 110 helps prevent straying of the magnetic flux generated by conductor 110.

Spiral Inductor Fabrication

Inductor 100 may be fabricated in any suitable manner. For one embodiment, inductor 100 is fabricated in accordance with flow diagram 200 as illustrated in FIG. 2.

Figure 2:
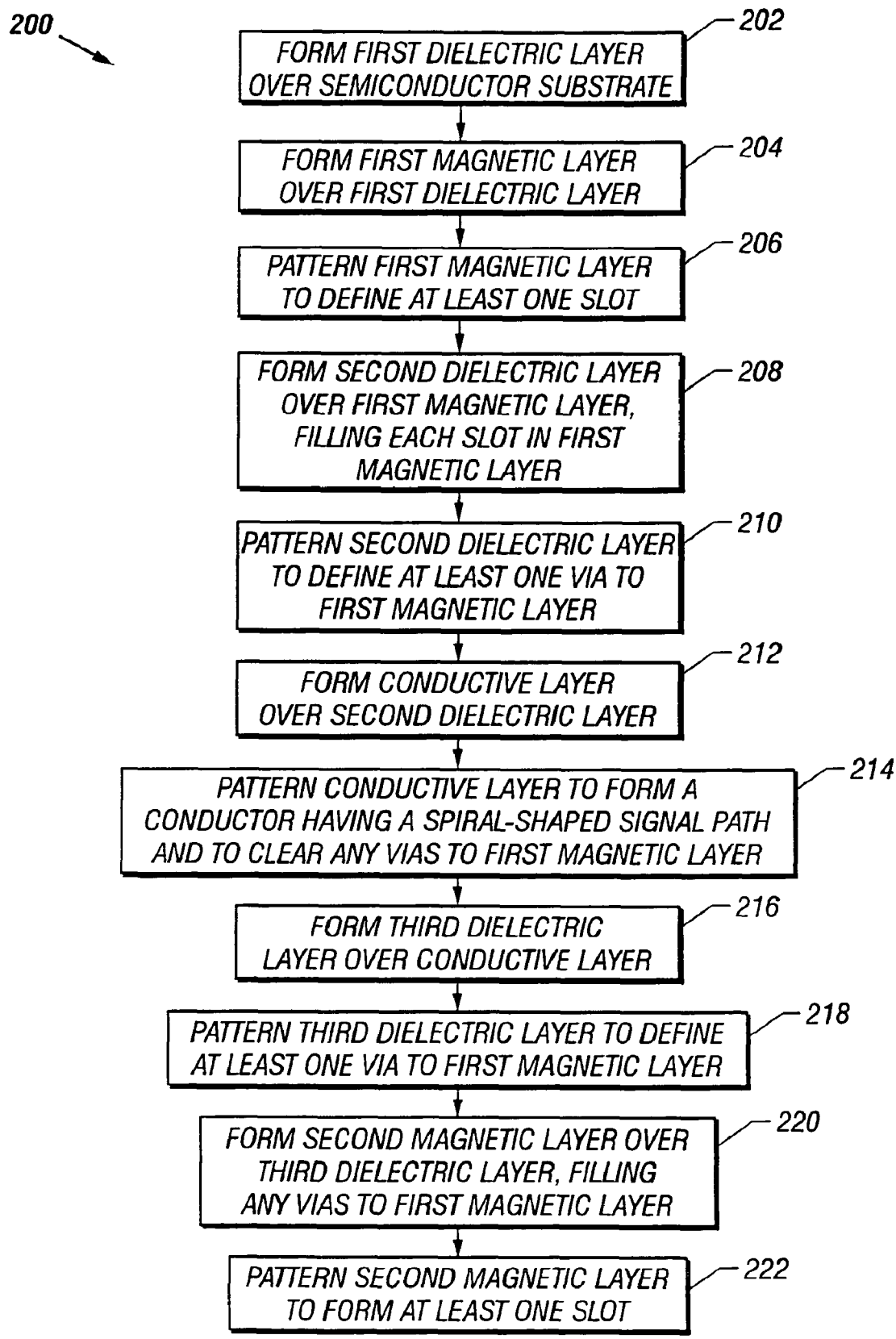
FIG. 2 illustrates, for one embodiment, a flow diagram to form the integrated inductor of FIG. 1.
Figure 3:
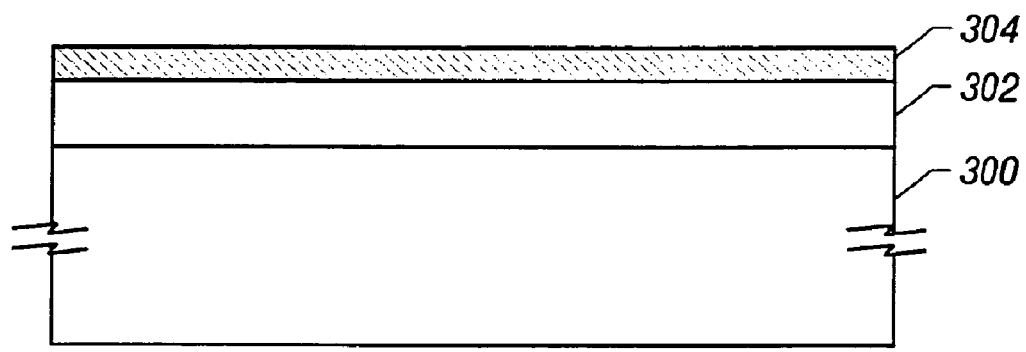
FIG. 3 illustrates, for one embodiment, a cross-sectional view of a substrate over which a first dielectric layer and a magnetic layer are formed.

For block 202 of FIG. 2, a first dielectric layer 302 is formed over a substrate 300 as illustrated in FIG. 3. The cross-sectional view of FIG. 3 generally corresponds to a cross-section at line A-A of inductor 100 as illustrated in FIG. 1. Substrate 300 may comprise any suitable semiconductor material, such as silicon (Si), silicon germanium (SiGe), germanium (Ge), or gallium arsenide (GaAs) for example. Dielectric layer 302 may comprise any suitable dielectric material, such as an oxide of silicon, silicon nitride, or silicon oxynitride for example, and may be formed to any suitable thickness using any suitable technique. Dielectric layer 302 helps insulate inductor 100 from substrate 300. For one embodiment, dielectric layer 302 is formed by depositing silicon dioxide ($SiO_2$) over substrate 300 to a thickness of approximately 2 microns (μm) using a suitable chemical vapor deposition (CVD) technique. For another embodiment where substrate 300 comprises silicon (Si), dielectric layer 302 may be formed by growing approximately 2 microns (μm) of silicon dioxide ($SiO_2$) on substrate 300.

Although illustrated in FIG. 3 as forming dielectric layer 302 directly over substrate 300, dielectric layer 302 may be formed over one or more suitable layers, such as one or more interconnect, via, dielectric, and/or device layers for example, formed over substrate 300.

For block 204, a magnetic layer 304 is formed over dielectric layer 302 as illustrated in FIG. 3. Magnetic layer 304 corresponds to magnetic layer 120 of FIG. 1. Magnetic layer 304 may comprise any suitable magnetic material and may be formed to any suitable thickness using any suitable technique. For one embodiment, magnetic layer 304 is formed by sputter depositing an amorphous cobalt (Co) alloy, such as a suitable cobalt-zirconium-tantalum (CoZrTa) alloy for example, to a thickness in the range of approximately 0.1 microns (μm) to approximately 1.0 micron (μm) over dielectric layer 302. The magnetic material for one embodiment for magnetic layer 304 may be deposited in the presence of an applied magnetic field to induce desirable magnetic properties in magnetic layer 304.

Figure 4:
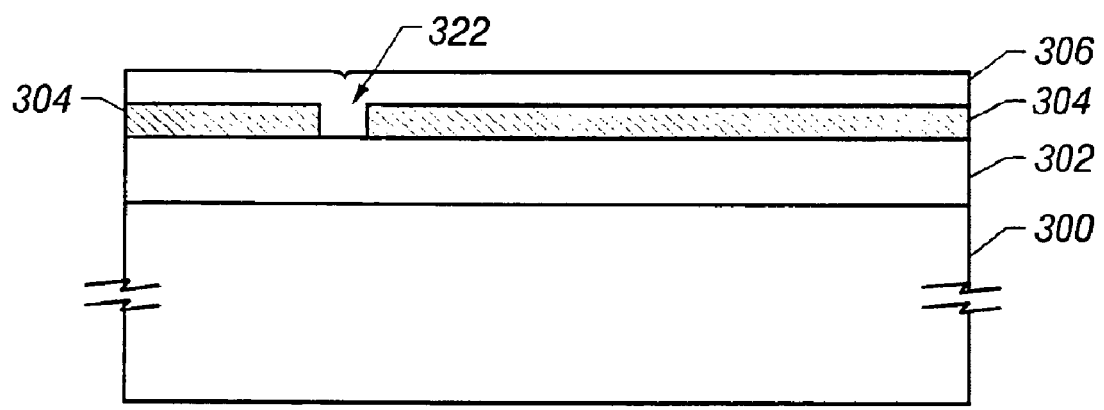
FIG. 4 illustrates, for one embodiment, a cross-sectional view of the substrate of FIG. 3 after the first magnetic layer has been patterned and a second dielectric layer has been formed.

For block 206, magnetic layer 304 is patterned to define at least one slot, such as slot 322 for example, as illustrated in FIG. 4. Magnetic layer 304 may be patterned to define any suitable number of one or more slots with any suitable dimensions and orientation at any suitable one or more locations. Magnetic layer 304 for one embodiment is patterned to define slots having a width in the range of approximately 0.05 microns (μm) to approximately 15 microns (μm). Magnetic layer 304 for one embodiment is patterned to define a conductive underpass 126 to innermost node 112 of inductor 110 as illustrated in FIG. 1 to allow a voltage potential to be applied to node 112.

Magnetic layer 304 may be patterned using any suitable patterning technique. Magnetic layer 304 for one embodiment is patterned by forming a patterned mask over magnetic layer 304, etching magnetic layer 304 to pattern magnetic layer 304 in accordance with the patterned mask, and removing the patterned mask. The patterned mask may comprise any suitable material, such as photoresist for example, formed to any suitable thickness and may be patterned using any suitable technique. Magnetic layer 304 may be etched using any suitable etch technique, such as a suitable wet etching technique for example.

Forming magnetic layer 304 and/or patterning magnetic layer 304 to define one or more slots is optional.

For block 208, a second dielectric layer 306 is formed over magnetic layer 304 as illustrated in FIG. 4. Dielectric layer 306 corresponds to the dielectric layer between magnetic layer 120 and conductor 110 of FIG. 1 and helps insulate magnetic layer 120 from conductor 110. For one embodiment where magnetic layer 304 defines one or more slots, dielectric layer 306 fills each such slot. For one embodiment where magnetic layer 304 is patterned to define conductive underpass 126, dielectric layer 306 fills the slots surrounding conductive underpass 126.

Dielectric layer 306 may comprise any suitable dielectric material, such as an oxide of silicon, silicon nitride, or silicon oxynitride for example, and may be formed to any suitable thickness using any suitable technique. For one embodiment, dielectric layer 306 is formed by depositing silicon dioxide ($SiO_2$) over magnetic layer 304 to a thickness of approximately 10,000 angstroms (Å) using a tetraethyl orthosilicate (TEOS) silicon dioxide ($SiO_2$) plasma enhanced chemical vapor deposition (PECVD) system.

Figure 5:
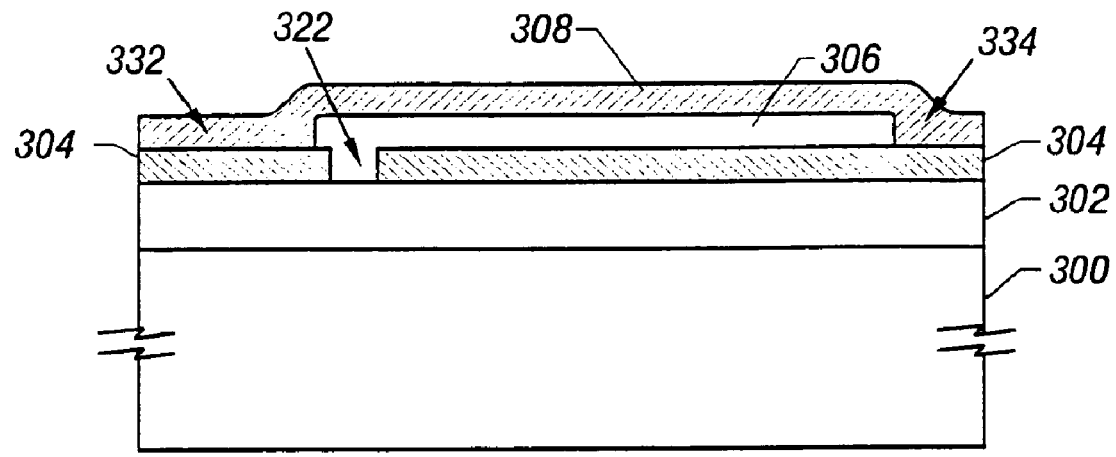
FIG. 5 illustrates, for one embodiment, a cross-sectional view of the substrate of FIG. 4 after the second dielectric layer has been patterned and a conductive layer has been formed.

For block 210, dielectric layer 306 is patterned to define at least one via to magnetic layer 304, such as vias 332 and 334 for example, as illustrated in FIG. 5. Dielectric layer 306 for one embodiment is patterned to define at least one via in region 132 within innermost turn 114 of conductor 110 as illustrated in FIG. 1 to connect magnetic layer 304 with another magnetic layer. Dielectric layer 306 for one embodiment is patterned to define at least one via in one or more regions, such as regions 134 and 136 for example, along a perimeter surrounding outermost turn 118 of conductor 110 as illustrated in FIG. 1. For one embodiment where magnetic layer 304 defines conductive underpass 126 extending across the perimeter to node 112 and conductor 110 defines a conductive connection extending across the perimeter to node 116, as illustrated in FIG. 1, dielectric layer 306 is not patterned with any via along the perimeter in such regions. For one embodiment where magnetic layer 304 defines conductive underpass 126, dielectric layer 306 is patterned to form a via to conductive underpass 126 to connect node 112 to conductive underpass 126.

Dielectric layer 306 may be patterned using any suitable patterning technique. Dielectric layer 306 for one embodiment is patterned by forming a patterned mask over dielectric layer 306, etching dielectric layer 306 to pattern dielectric layer 306 in accordance with the patterned mask, and removing the patterned mask. The patterned mask may comprise any suitable material, such as photoresist for example, formed to any suitable thickness and may be patterned using any suitable technique. Dielectric layer 306 may be etched using any suitable etch technique, such as a suitable dry etch technique for example.

Forming dielectric layer 306 is optional. Dielectric layer 306 may not be formed, for example, where magnetic layer 304 is not formed. Patterning dielectric layer 306 to define one or more vias to magnetic layer 304 is optional. Dielectric layer 306 may not be patterned, for example, where magnetic layer 304 does not define conductive underpass 126 and where magnetic layer 304 is not to be connected to another magnetic layer.

For block 212, a conductive layer 308 is formed over dielectric layer 306 as illustrated in FIG. 5. For one embodiment where dielectric layer 306 defines one or more vias to magnetic layer 304, conductive layer 308 fills any such vias.

Conductive layer 308 may comprise any suitable conductive material and may be formed to any suitable thickness using any suitable technique. Suitable conductive materials include, for example, copper (Cu), aluminum (Al), tungsten (W), molybdenum (Mo), titanium (Ti), gold (Au), silver (Ag), a metal silicide, a metal nitride, polysilicon, or an alloy containing one or more such conductive materials, such as an aluminum-copper (AlCu) alloy, an aluminum-silicon (AlSi) alloy, an aluminum-copper-silicon (AlCuSi) alloy, and a titanium nitride (TiN) alloy for example. For one embodiment, conductive layer 308 is formed by sputter depositing an aluminum-copper-silicon (AlCuSi) alloy over dielectric layer 306 to a thickness of approximately 1 micron (μm).

Conductive layer 308 for one embodiment may also be formed to comprise an underlying adhesion and/or diffusion barrier layer and/or an overlying adhesion and/or diffusion barrier layer. Conductive layer 308 for one embodiment may also be formed to comprise any overlying layer that serves as an anti-reflective coating for lithography and/or that helps prevent hillocking of the conductive material for conductive layer 308. For one embodiment where conductive layer 308 comprises an aluminum-copper-silicon (AlCuSi) alloy, a titanium (Ti) layer may be deposited prior to depositing the aluminum-copper-silicon alloy and another titanium (Ti) layer may be deposited over the deposited aluminum-copper-silicon alloy.

Figure 6:
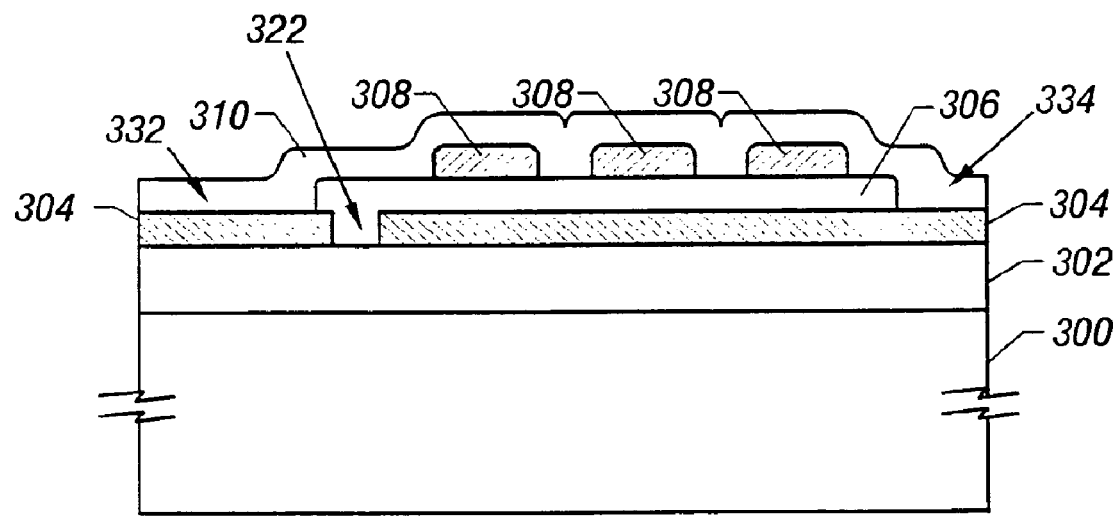
FIG. 6 illustrates, for one embodiment, a cross-sectional view of the substrate of FIG. 5 after the conductive layer has been patterned and a third dielectric layer has been formed.

For block 214, conductive layer 308 is patterned to form conductor 110 as illustrated in FIGS. 1 and 6. Conductive layer 308 may be patterned to define a signal path having any suitable width, thickness, and length and any suitable spacing between turns to form a generally spiral-shaped conductor 110 covering an area of any suitable shape and size. For one embodiment where dielectric layer 306 defines one or more vias to magnetic layer 304, conductive layer 308 is also patterned to remove conductive layer 308 from any such vias. Where magnetic layer 304 defines conductive underpass 126, however, conductive layer 308 for one embodiment is not removed from any via to conductive underpass 126. In this manner, conductive layer 308 helps connect conductive underpass 126 to node 112 of conductor 110.

Conductive layer 308 may be patterned using any suitable patterning technique. Conductive layer 308 for one embodiment is patterned by forming a patterned mask over conductive layer 308, etching conductive layer 308 to pattern conductive layer 308 in accordance with the patterned mask, and removing the patterned mask. The patterned mask may comprise any suitable material, such as a photoresist and a silicon dioxide ($SiO_2$) hard mask for example, formed to any suitable thickness and may be patterned using any suitable technique. Conductive layer 308 may be etched using any suitable etch technique, such as a suitable plasma dry etching technique for example.

For block 216, a third dielectric layer 310 is formed over conductive layer 308 as illustrated in FIG. 6. Dielectric layer 310 for one embodiment helps insulate conductive layer 308 from another magnetic layer. Dielectric layer 310 fills the areas removed from conductive layer 308 in patterning conductive layer 308 to form conductor 110. Dielectric layer 310 also fills any exposed vias in dielectric layer 306.

Dielectric layer 310 may comprise any suitable dielectric material, such as an oxide of silicon, silicon nitride, or silicon oxynitride for example, and may be formed to any suitable thickness using any suitable technique. For one embodiment, dielectric layer 310 is formed by depositing silicon dioxide ($SiO_2$) over conductive layer 308 to a thickness of approximately 10,000 angstroms (Å) using a tetraethyl orthosilicate (TEOS) silicon dioxide ($SiO_2$) plasma enhanced chemical vapor deposition (PECVD) system.

Figure 7:
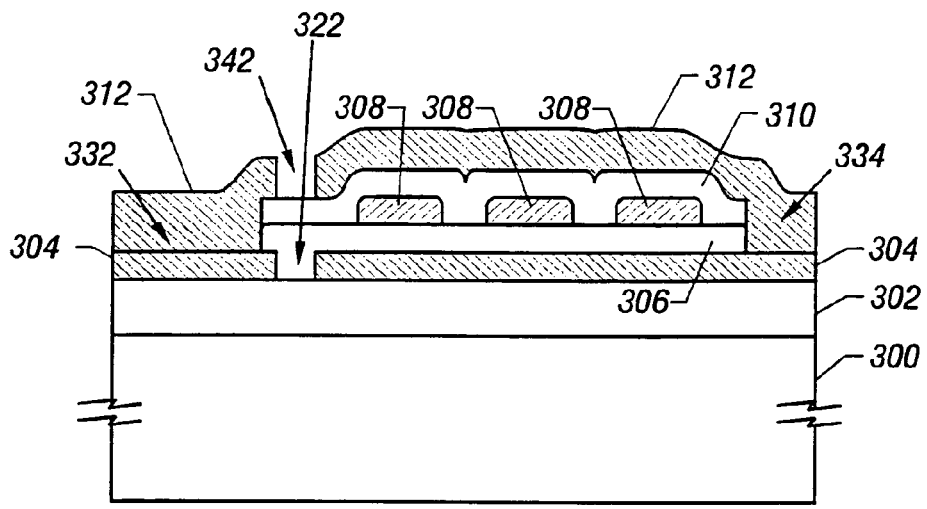
FIG. 7 illustrates, for one embodiment, a cross-sectional view of the substrate of FIG. 6 after the third dielectric layer has been patterned and a second magnetic layer has been formed and patterned.

For block 218, dielectric layer 310 is patterned to define at least one via extending to magnetic layer 304 as illustrated in FIG. 7. Dielectric layer 310 for one embodiment is patterned to define a via extending through each exposed via defined by dielectric layer 306.

Dielectric layer 310 may be patterned using any suitable patterning technique. Dielectric layer 310 for one embodiment is patterned by forming a patterned mask over dielectric layer 310, etching dielectric layer 310 to pattern dielectric layer 310 in accordance with the patterned mask, and removing the patterned mask. The patterned mask may comprise any suitable material, such as photoresist for example, formed to any suitable thickness and may be patterned using any suitable technique. Dielectric layer 310 may be etched using any suitable etch technique, such as a suitable dry etch technique for example.

Forming dielectric layer 310 is optional. Dielectric layer 310 may not be formed, for example, where another magnetic layer is not to be formed over conductive layer 308. Patterning dielectric layer 310 to define one or more vias to magnetic layer 304 is optional. Dielectric layer 310 may not be patterned, for example, where magnetic layer 304 is not formed or where magnetic layer 304 is not to be connected to another magnetic layer formed over conductive layer 308.

For block 220, a second magnetic layer 312 is formed over dielectric layer 302 as illustrated in FIG. 7. For one embodiment where dielectric layers 306 and 310 define one or more vias to magnetic layer 304, magnetic layer 312 fills any such vias. In this manner, one or more connections between magnetic layer 304 and magnetic layer 312 may be formed.

Magnetic layer 312 may comprise any suitable magnetic material and may be formed to any suitable thickness using any suitable technique. For one embodiment, magnetic layer 312 is formed by sputter depositing an amorphous cobalt (Co) alloy, such as a suitable cobalt-zirconium-tantalum (CoZrTa) alloy for example, to a thickness in the range of approximately 0.1 microns (μm) to approximately 1.0 micron (μm) over dielectric layer 310. The magnetic material for one embodiment for magnetic layer 312 may be deposited in the presence of an applied magnetic field to induce desirable magnetic properties in magnetic layer 312.

For block 222, magnetic layer 312 is patterned to define at least one slot, such as slot 342 for example, as illustrated in FIG. 7. Magnetic layer 312 may be patterned to define any suitable number of one or more slots with any suitable dimensions and orientation at any suitable one or more locations. Magnetic layer 312 for one embodiment is patterned to define slots having a width in the range of approximately 0.05 microns (μm) to approximately 15 microns (Mm).

Magnetic layer 312 may be patterned using any suitable patterning technique. Magnetic layer 312 for one embodiment is patterned by forming a patterned mask over magnetic layer 312, etching magnetic layer 312 to pattern magnetic layer 312 in accordance with the patterned mask, and removing the patterned mask. The patterned mask may comprise any suitable material, such as photoresist for example, formed to any suitable thickness and may be patterned using any suitable technique. Magnetic layer 312 may be etched using any suitable etch technique, such as a suitable wet etching technique for example.

Forming magnetic layer 312 and/or patterning magnetic layer 312 to define one or more slots is optional.

Although illustrated as using only magnetic material to connect magnetic layer 312 to magnetic layer 304, any suitable conductive material may also be used. For one embodiment, any vias in dielectric layer 306 to magnetic layer 304 may be filled with conductive material in forming and patterning conductive layer 308 for blocks 212 and 214. Dielectric layer 310 may then be patterned for block 218 to define at least one via to any such filled vias. As magnetic material fills any vias in dielectric layer 310 in forming magnetic layer 312 for block 220, one or more connections between magnetic layer 304 and magnetic layer 312 is formed.

Although illustrated as comprising conductive underpass 126 defined by magnetic layer 304, inductor 100 for another embodiment may also or instead comprise a similar conductive overpass defined by magnetic layer 312 to allow a voltage potential to be applied to node 112.

For another embodiment, inductor 100 may be fabricated such that a voltage potential may be applied to node 112 and/or node 116 from beneath magnetic layer 304. Also, inductor 100 may be fabricated such that a voltage potential may be applied to node 112 and/or node 116 from above magnetic layer 312. Nodes 112 and/or 116 may each be conductively coupled to circuitry from beneath and/or above inductor 100 by forming a respective via through magnetic layer 304 and/or magnetic layer 312 and filling the via with a suitable conductive material. For another embodiment, a portion of magnetic layer 304 and/or magnetic layer 312 may optionally be isolated to serve as a portion of a conductive contact to conductor 110. By conductively coupling both nodes 112 and 116 through magnetic layer 304 and/or magnetic layer 312 in this manner, magnetic layers 304 and 312 may be connected continuously along the full perimeter surrounding outermost turn 118.

For one embodiment where inductor 100 comprises only magnetic layer 304 or magnetic layer 312, dielectric layer 306 and/or dielectric layer 310 may nevertheless be patterned with at least one via in region 132 and/or in one or more regions along a perimeter surrounding conductor 110, as illustrated in FIG. 1, for subsequent filling with a suitable magnetic or conductive material.

Inductor 100 for another embodiment is fabricated using a suitable damascene process to form conductor 110. Rather than forming and patterning conductive layer 308, dielectric layer 306 or another dielectric layer formed over dielectric layer 306 may be patterned to define suitable trenches and/or vias such that a conductive material, such as copper (Cu) for example, may be deposited over the dielectric layer and polished with a suitable chemical-mechanical polishing (CMP) technique, for example, to form conductor 110. One or more vias to magnetic layer 304 may then be defined through the dielectric layer.

Magnetic Layer Processing

Figure 8:
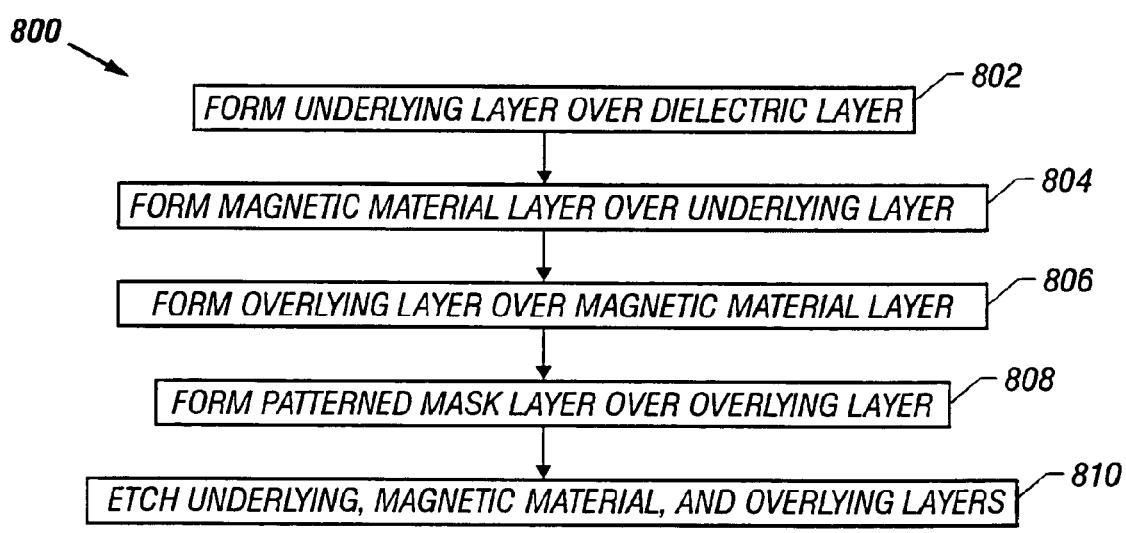
FIG. 8 illustrates, for one embodiment, a flow diagram to form a magnetic layer.

Magnetic layers 304 and 312 may each be formed and patterned in any suitable manner. For one embodiment, each magnetic layer 304 and 312 is formed and patterned in accordance with flow diagram 800 as illustrated in FIG. 8. Flow diagram 800 is described in the context of magnetic layer 304 for the sake of simplicity.

Figure 9:
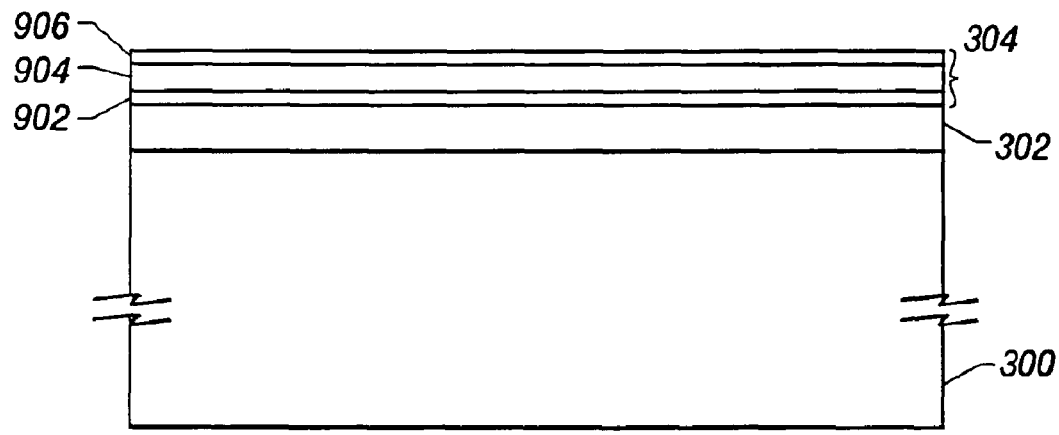
FIG. 9 illustrates, for one embodiment, a cross-sectional view of a substrate over which a dielectric layer and a magnetic layer have been formed.

For block 802 of FIG. 8, an underlying layer 902 is formed over dielectric layer 302 as illustrated in FIG. 9. Layer 902 may serve as an adhesion layer and/or as a diffusion barrier layer for magnetic layer 304.

Layer 902 may comprise any suitable material and may be formed to any suitable thickness using any suitable technique. For one embodiment where the magnetic material for magnetic layer 304 comprises an amorphous cobalt (Co) alloy, such as cobalt-zirconium-tantalum (CoZrTa) for example, titanium (Ti) may be sputter deposited over dielectric layer 302 to a suitable thickness, such as approximately 250 angstroms (Å) for example, using a physical vapor deposition (PVD) system, for example, to form layer 902. Titanium (Ti) helps the cobalt (Co) alloy adhere to dielectric layer 302.

Layer 902 is optional and may not be used, for example, where adhesion and/or diffusion are of minimized concern for the magnetic material of magnetic layer 304.

For block 804 of FIG. 8, a magnetic material layer 904 is formed over underlying layer 902 as illustrated in FIG. 9. Magnetic material layer 904 may comprise any suitable material and may be formed to any suitable thickness using any suitable technique.

Magnetic material layer 904 for one embodiment comprises cobalt (Co). Magnetic material layer 904 for one embodiment comprises an amorphous cobalt (Co) alloy comprising cobalt (Co) and any suitable one or more elements of any suitable atomic or weight percentage. The amorphous cobalt (Co) alloy may have any suitable atomic order. For one embodiment, the amorphous cobalt (Co) alloy has an atomic order in the range of approximately 1 angstrom (Å) to approximately 100 angstroms (Å). For one embodiment, the amorphous cobalt (Co) alloy has an atomic order in the range of approximately 1 angstrom (Å) to approximately 25 angstroms (Å). For one embodiment, the amorphous cobalt (Co) alloy has an atomic order in the range of approximately 1 angstrom (Å) to approximately 10 angstroms (Å).

Magnetic material layer 904 for one embodiment comprises an amorphous cobalt (Co) alloy comprising cobalt (Co) and zirconium (Zr). Zirconium (Zr) helps make cobalt (Co)

amorphous. Magnetic material layer 904 for one embodiment comprises a cobalt-zirconium (CoZr) alloy having one or more additional elements, such as tantalum (Ta) and niobium (Nb) for example, that help make the cobalt-zirconium (CoZr) alloy magnetically softer. Magnetic material layer 904 for one embodiment comprises a cobalt-zirconium (CoZr) alloy having one or more additional elements, such as a rare earth element for example, that help increase the ferromagnetic resonance of the cobalt-zirconium (CoZr) alloy. Rare earth elements include rhenium (Re), neodymium (Nd), praseodymium (Pr), and dysprosium (Dy) for example. Rhenium (Re) helps reduce stress and magnetostriction for the cobalt-zirconium (CoZr) alloy.

Where magnetic material layer 904 comprises a cobalt-zirconium (CoZr) alloy, magnetic material layer 904 may comprise, for example, approximately 3 atomic percent to approximately 10 atomic percent zirconium (Zr).

Where magnetic material layer 904 comprises a cobalt-zirconium-tantalum (CoZrTa) alloy, magnetic material layer 904 may comprise, for example, approximately 3 atomic percent to approximately 10 atomic percent zirconium (Zr) and may comprise up to and including approximately 10 atomic percent tantalum (Ta). Magnetic material layer 904 for one embodiment comprises approximately 91.5 atomic percent cobalt (Co), approximately 4 atomic percent zirconium (Zr), and approximately 4.5 atomic percent tantalum (Ta). Such a CoZrTa alloy can operate in the GigaHertz (GHz) range and can withstand temperatures up to approximately 450° Celsius without crystallizing or significantly changing its relevant properties.

Where magnetic material layer 904 comprises a cobalt-zirconium-rhenium (CoZrRe) alloy, magnetic material layer 904 may comprise, for example, approximately 3 atomic percent to approximately 10 atomic percent zirconium (Zr) and may comprise up to and including approximately 3 atomic percent rhenium (Re). Magnetic material layer 904 for one embodiment comprises approximately 89 atomic percent cobalt (Co), approximately 8 atomic percent zirconium (Zr), and approximately 3 atomic percent rhenium (Re).

Magnetic material layer 904 may be formed to any suitable thickness. Magnetic material layer 904 for one embodiment has a thickness in the range of approximately 0.05 microns (μm) to approximately 2.0 microns (μm). Magnetic material layer 904 for one embodiment has a thickness in the range of approximately 0.1 microns (μm) to approximately 1.0 micron (μm). Magnetic material layer 904 for one embodiment has a thickness of approximately 0.4 microns (μm).

Magnetic material layer 904 for one embodiment is sputter deposited using a physical vapor deposition (PVD) system, for example. Magnetic material layer 904 for one embodiment is deposited in the presence of an applied magnetic field to induce desirable magnetic properties in magnetic material layer 904. Magnetic material layer 904 may be deposited, for example, in the presence of a fixed magnetic field, an approximately 180° switching magnetic field, or an orthogonal switching magnetic field.

Magnetic material layer 904 for one embodiment may be deposited in sublayers of any suitable thickness, such as approximately 0.2 microns (μm) for example, to help prevent overheating and crystal growth during deposition. Each sublayer for one embodiment may be deposited in the presence of a magnetic field in such a manner so as to induce a magnetic anisotropy in the sublayer in a direction parallel to the plane of the sublayer and orthogonal to that of another sublayer. Each sublayer may, for example, be deposited in the presence of an orthogonal switching magnetic field. Substrate 300 may also be repositioned relative to a fixed magnetic field as each sublayer is deposited so as to induce the orthogonal magnetic fields.

For block 806 of FIG. 8, an overlying layer 906 is formed over magnetic material layer 904 as illustrated in FIG. 9. Layer 906 may serve as an adhesion layer, a diffusion barrier layer, and/or as an anti-reflective coating for lithography for magnetic layer 304. Layer 906 may comprise any suitable material and may be formed to any suitable thickness using any suitable technique.

For one embodiment where magnetic material layer 904 comprises cobalt (Co), titanium (Ti) may be sputter deposited over magnetic material layer 904 to a suitable thickness, such as approximately 250 angstroms (Å) for example, using a physical vapor deposition (PVD) system, for example, to form layer 906. Titanium (Ti) helps photoresist adhere to cobalt (Co) in patterning magnetic layer 304, helps protect cobalt (Co) from relatively high temperature processes that could potentially oxidize the top surface of magnetic material layer 904 and possibly damage the relevant properties of cobalt (Co), and may help reduce any undercutting in etching magnetic material layer 904.

For another embodiment where magnetic material layer 904 comprises cobalt (Co), magnetic material layer 904 is oxidized to form layer 906 comprising cobalt oxide ($CoO_x$). Cobalt oxide ($CoO_x$) may be formed to any suitable thickness, such as in the range of approximately 10 angstroms (Å) to approximately 100 angstroms (Å) for example. Magnetic material layer 904 for one embodiment is briefly ashed with a suitable relatively low lamp, low temperature recipe to oxidize cobalt (Co) while minimizing any damage to the relevant properties of cobalt (Co). Oxidizing cobalt (Co) in this manner helps photoresist adhere to cobalt (Co) in patterning magnetic layer 304.

Layer 906 is optional and may not be used, for example, where adhesion is of minimized concern for the magnetic material of magnetic layer 304.

Figure 10:
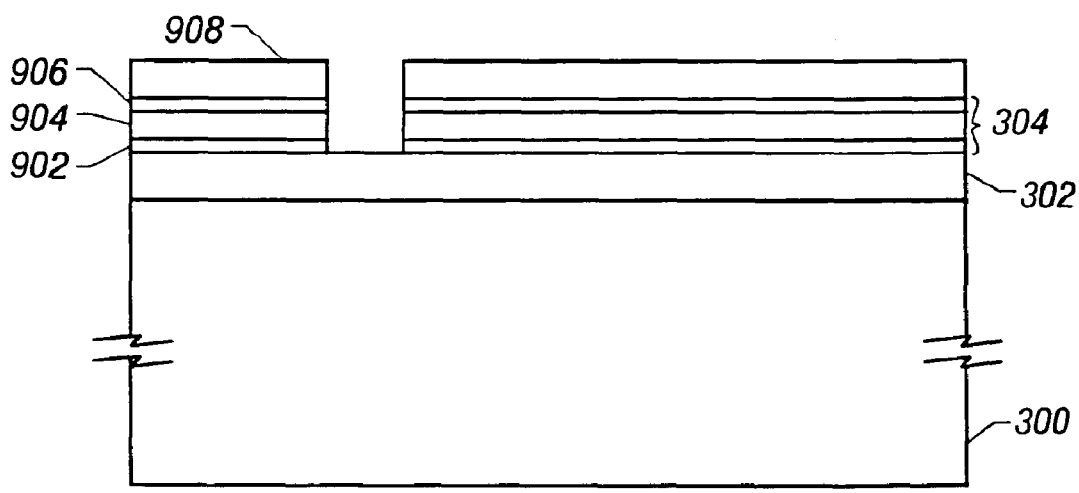
FIG. 10 illustrates, for one embodiment, a cross-sectional view of the substrate of FIG. 9 after a patterned mask layer has been formed and the magnetic layer has been patterned.

For block 808, a patterned mask layer 908 is formed over magnetic layer 304 as illustrated in FIG. 10. Mask layer 908 may comprise any suitable material and may have any suitable thickness. Mask layer 908 may be patterned using any suitable technique. Mask layer 908 for one embodiment comprises photoresist that is spun on and then patterned by exposing mask layer 908 through a suitable mask and developing mask layer 908.

For block 810, underlying layer 902, magnetic material layer 904, and overlying layer 906 are etched as illustrated in FIG. 10. Magnetic layer 304 for one embodiment is etched using a suitable wet etching technique. For one embodiment where layer 906 comprises titanium (Ti) or cobalt oxide ($CoO_x$), a suitable dilute hydrofluoric (HF) acid solution is used to etch layer 906 exposed by mask layer 908. For one embodiment, an approximately 50:1 HF acid solution is used. For one embodiment where magnetic material layer 904 comprises cobalt (Co), a solution of nitric acid is used to wet etch magnetic material layer 904 exposed by mask layer 908. For one embodiment, an approximately 10% solution of nitric ($HNO_3$) acid is used. For one embodiment where layer 906 comprises titanium (Ti), layer 906 helps reduce any undercutting in wet etching magnetic material layer 904. For one embodiment where layer 902 comprises titanium (Ti), a suitable dilute hydrofluoric (HF) acid solution is used to etch layer 902 exposed by mask layer 908. For one embodiment, an approximately 50:1 HF acid solution is used.

As substrate 300 is further processed in accordance with flow diagram 200 of FIG. 2, for example, each subsequent process technique is to account for the presence of magnetic layer 304. As one example where magnetic layer 304 comprises cobalt (Co), exposing magnetic layer 304 to a plasma or atmosphere containing oxygen at relatively high temperatures may damage the relevant properties of magnetic layer 304. The effects of subsequent process techniques on magnetic layer 304 may be monitored using a permeance meter, for example.

For one embodiment where magnetic layer 304 comprises cobalt (Co), silicon dioxide ($SiO_2$) is deposited to form dielectric layer 306, for example, using a suitable plasma enhanced chemical vapor deposition (PECVD) system with tetraethyl orthosilicate (TEOS) to help maintain a temperature below approximately 450° Celsius and therefore help minimize any oxidation and crystallization of magnetic layer 304.

For one embodiment where photoresist, for example, is to be removed from magnetic layer 304, dielectric layer 306, and/or from a silicon dioxide ($SiO_2$) hard mask over conductive layer 308, a suitable relatively low temperature resist strip technique and a suitable solvent may be used instead of a typical relatively high temperature ash technique to avoid exposing magnetic layer 304 to plasmas at relatively high temperatures for relatively long periods of time. For another embodiment where photoresist, for example, is used in etching silicon dioxide ($SiO_2$), such as for dielectric layer 306 for example, the silicon dioxide ($SiO_2$) may be etched using a suitable relatively low power and relatively low temperature dry etch technique to help minimize any hardening of the photoresist. The photoresist may then be removed using a suitable solvent.

Following fabrication of inductor 100 with magnetic layer 304 and/or magnetic layer 312, magnetic layer 304 and/or magnetic layer 312 may be annealed by exposing inductor 100 to a suitable temperature in the presence of a magnetic field to help vitalize the magnetic properties of magnetic layer 304 and/or magnetic layer 312.

Although described in the context of inductor 100 as illustrated in FIG. 1, one or more magnetic layers may be formed and possibly patterned in fabricating other suitable inductors having other suitable structures. As one example, inductor 100 may be fabricated with a multi-level conductor formed across multiple layers and/or with multiple conductors. Inductor 100 for one embodiment may be formed with multiple conductors coupled in series or in parallel. Also, one or more magnetic layers may be formed and possibly patterned in fabricating other suitable integrated circuit devices, such as an integrated transformer formed using one or more inductors similar to inductor 100.

Integrated Transformer Structure and Fabrication

Figure 11:
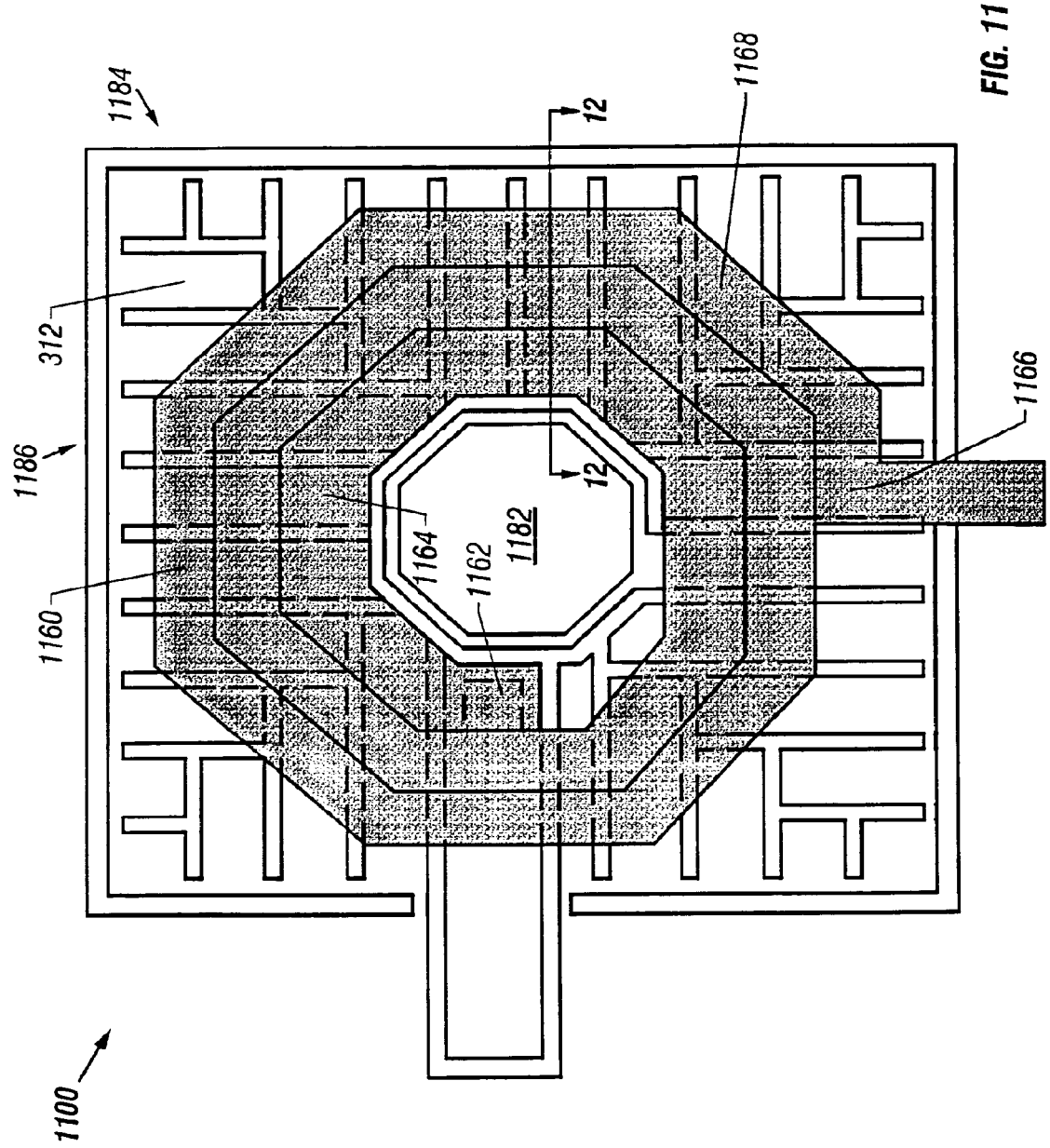
FIG. 11 illustrates, for one embodiment, a plan view of an integrated transformer.
Figure 12:
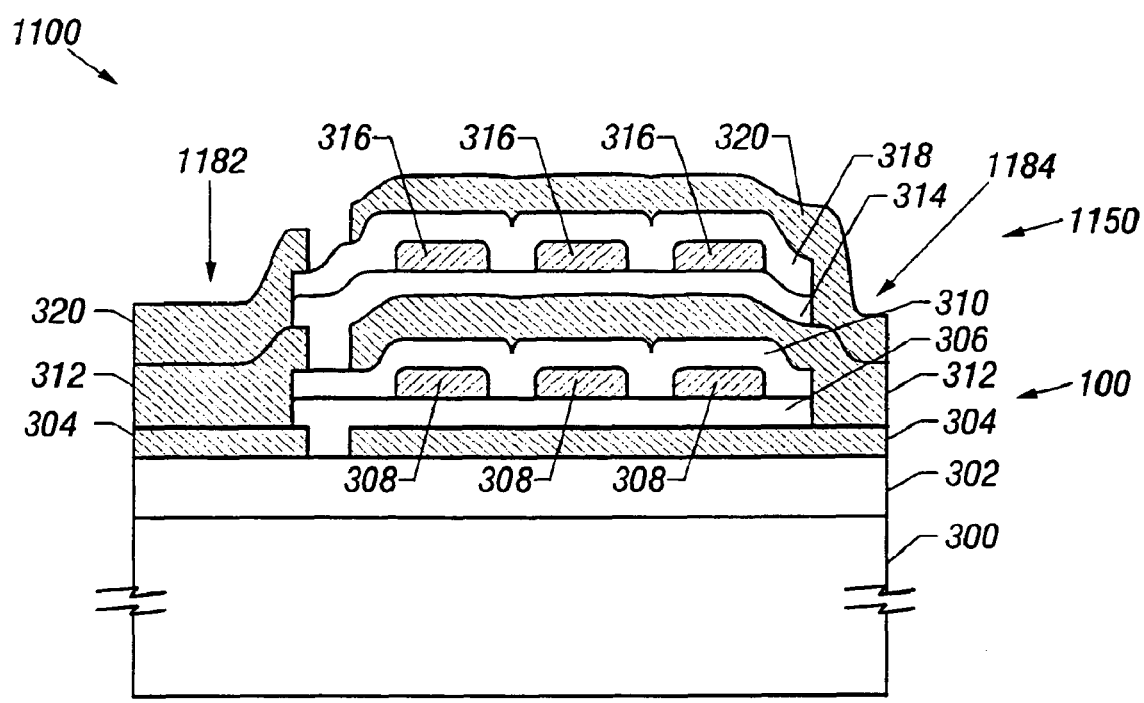
FIG. 12 illustrates, for one embodiment, a cross-sectional view of the integrated transformer of FIG. 11.

FIG. 11 illustrates, for one embodiment, an integrated transformer 1100. FIG. 12 illustrates, for one embodiment, a cross-sectional view of integrated transformer 1100. The cross-sectional view of FIG. 12 generally corresponds to a cross-section at line 12-12 of transformer 1100 as illustrated in FIG. 11.

As illustrated in FIG. 12, integrated transformer 1100 comprises integrated inductor 100 and another integrated inductor 1150 formed over inductor 100. Integrated inductor 1150 for one embodiment is similarly fabricated as inductor 100. Inductor 100 corresponds to a primary coil of a conventional transformer, and inductor 1150 corresponds to a secondary coil. As inductors 100 and 1150 are electrically isolated from one another, transformer 1100 for one embodiment may be used to couple signals or power from one circuit to another while isolating direct current (dc) biases. Transformer 1100 may also be used to help reduce noise.

As illustrated in FIG. 12, inductor 1150 comprises, similarly as inductor 100, a generally spiral-shaped conductor 1160 defining a signal path along which current may flow. Inductor 1150 is positioned relative to inductor 100 such that an electromagnetic field generated by inductor 100 induces a voltage potential across an innermost node 1162 near the beginning of an innermost turn 1164 of conductor 1160 and an outermost node 1166 near the end of an outermost turn 1168 of conductor 1160. Current then flows through conductor 1160. The induced voltage potential across inductor 1150 may be stepped up or stepped down from the voltage potential applied across inductor 100 as desired in designing inductors 100 and 1150 and in positioning inductors 100 and 1150 relative to one another.

Although each conductor 110 and 1160 is illustrated as defining approximately 2¾ generally octagonal-shaped turns, each conductor 110 and 1160 may define any suitable number of one or more turns and any suitable fraction of a turn of any suitable shape. Each turn may be rectangular, hexagonal, or circular in shape, for example. The number of turns defined by each conductor 110 and 1160 helps determine the amount of the voltage potential induced across inductor 1150 for a given voltage potential applied across inductor 100. The shape of each turn for each conductor 110 and 1160 may also help determine the amount of the voltage potential induced across inductor 1150 for a given voltage potential applied across inductor 100.

Each conductor 110 and 1160 may comprise any suitable conductive material and may have any suitable dimensions. The signal path defined by each conductor 110 and 1160 may have any suitable width, thickness, and length with any suitable spacing between turns and may cover an area of any suitable shape and size. The material and dimensions of each conductor 110 and 1160 and the spacing between turns for each conductor 110 and 1160 may help determine the amount of the voltage potential induced across inductor 1150 based on a given voltage potential applied across inductor 100.

Inductors 100 and 1150 may be positioned relative to one another in any suitable manner to induce any desirable voltage potential across inductor 1150 for a given voltage potential applied across inductor 100. Inductor 1150 for one embodiment is positioned relative to inductor 100 such that the signal path defined by conductor 1160 lies over and is generally parallel to the signal path defined by conductor 110. How inductors 100 and 1150 are positioned relative to one another and the proximity between inductors 100 and 1150 helps determine the amount of the voltage potential induced across inductor 1150 based on a given voltage potential applied across inductor 100.

Although described in the context of inductor 100 corresponding to a primary coil and inductor 1150 corresponding to a secondary coil, inductor 100 may also correspond to a secondary coil and inductor 1150 may correspond to a primary coil. That is, a voltage potential may be applied across nodes 1162 and 1166 of inductor 1150 to generate an electromagnetic field around both inductors 1150 and 100 and induce a voltage potential across nodes 112 and 116 of inductor 100.

Inductors 100 and 1150 for one embodiment are each fabricated to have an increased self-inductance to help increase the quality factor Q of each inductor 100 and 1150 and to help form transformer 1100 with a relatively high mutual inductance between inductors 100 and 1150.

As illustrated in FIG. 12, inductor 1150 for one embodiment is similarly fabricated as inductor 100. Inductor 1150 comprises magnetic layer 312, a first dielectric layer 314, a conductive layer 316 to form conductor 1160, a second dielectric layer 318, and a magnetic layer 320. Magnetic layer 312 serves as a second magnetic layer for inductor 100 and as a first magnetic layer for inductor 1150. Dielectric layer 314 helps insulate conductive layer 316 from magnetic layer 312. Dielectric layer 318 helps insulate magnetic layer 320 from conductive layer 316.

Inductor 1150 for one embodiment is fabricated in accordance with flow diagram 200 as illustrated in FIG. 2. After inductor 100 has been formed, dielectric layer 314 may be formed over inductor 100 and patterned similarly as dielectric layer 306 for blocks 208 and 210 of FIG. 2. Forming and/or patterning dielectric layer 314 is optional similarly as dielectric layer 306. Dielectric layer 314 may not be formed, for example, where inductor 100 does not comprise magnetic layer 312 and does comprise dielectric layer 310.

Conductive layer 316 may be formed and patterned to form conductor 1160 similarly as conductive layer 308 for blocks 212 and 214 of FIG. 2.

Dielectric layer 318 may be formed and patterned similarly as dielectric layer 310 for blocks 216 and 218 of FIG. 2. Forming and/or patterning dielectric layer 318 is optional similarly as dielectric layer 310.

Magnetic layer 320 may be formed and patterned similarly as magnetic layer 312 for blocks 220 and 222 of FIG. 2. Forming and/or patterning magnetic layer 320 is optional similarly as magnetic layer 312.

Magnetic layers 304 and/or 312 help increase the self-inductance of inductor 100, and magnetic layers 312 and/or 320 help increase the self-inductance of inductor 1150. Magnetic layers 304, 312, and/or 320 help increase the mutual inductance between inductors 100 and 1150. Each magnetic layer 304, 312, and 320 may comprise any suitable magnetic material and have any suitable shape, such as the rectangular shape illustrated in FIGS. 1 and 11 for example, and any suitable dimensions. Each magnetic layer 304, 312, and 320 may or may not comprise the same magnetic material as any other magnetic layer 304, 312, or 320. Any one or more of magnetic layers 304, 312, and 320 may optionally define any suitable number of one or more slots.

Transformer 1100 for one embodiment may optionally comprise one of magnetic layers 304, 312, and 320 to help increase the inductance of inductor 100 and/or inductor 1150. Transformer 1100 for another embodiment may optionally comprise two of magnetic layers 304, 312, and 320 to help further increase the inductance of inductor 100 and/or inductor 1150. Transformer 1100 for another embodiment may comprise all three magnetic layers 304, 312, and 320 to help even further increase the inductance of inductor 100 and/or inductor 1150.

For one embodiment where transformer 1100 comprises two or more of magnetic layers 304, 312, and 320, each such magnetic layer 304, 312, or 320 may optionally be connected to another magnetic layer 304, 312, or 320 with any suitable magnetic and/or conductive material. Magnetic layers 304 and 312 may be connected, as illustrated in FIG. 1, through a region 132 within innermost turn 114 of conductor 110 and/or at one or more regions, such as regions 134 and 136 for example, along a perimeter surrounding outermost turn 118 of conductor 110. Magnetic layers 312 and 320 may be connected, as illustrated in FIG. 11, through a region 1182 within innermost turn 1164 of conductor 1160 and/or at one or more regions, such as regions 1184 and 1186 for example, along a perimeter surrounding outermost turn 1168 of conductor 1160. Magnetic layers 304 and 320 may be connected through regions 132 and 1182 and/or at one or more regions, such as regions 134 and 1184 and regions 136 and 1186 for example, along a perimeter surrounding conductors 110 and 1160. Two or more of magnetic layers 304, 312, and 320 may be connected along a perimeter of any suitable shape, such as the rectangular shape illustrated in FIGS. 1 and 11 for example.

Connecting two or more of magnetic layers 304, 312, and 320 helps increase the self-inductance of inductor 100 and/or inductor 1150 and the mutual inductance between inductor 100 and 1150. Connecting two or more of magnetic layers 304, 312, and 320 at most or substantially all regions along a perimeter surrounding conductor 110 and/or conductor 1160 helps prevent straying of the magnetic flux generated by conductor 110 and/or conductor 1160.

Figure 13:
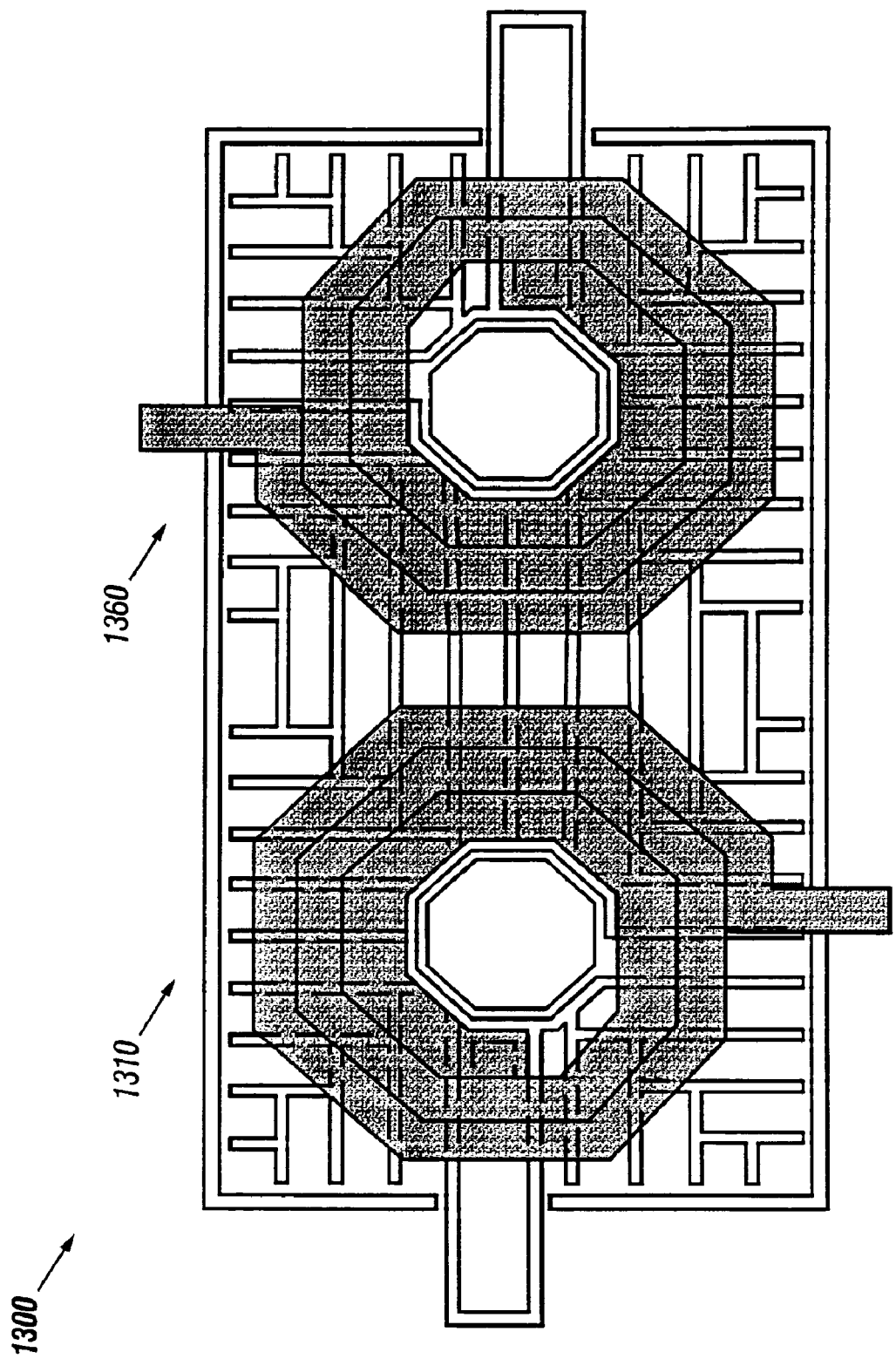
FIG. 13 illustrates, for one embodiment, a plan view of another integrated transformer.

FIG. 13 illustrates, for one embodiment, another integrated transformer 1300. Integrated transformer 1300 comprises integrated inductor 1310 and another integrated inductor 1360. As illustrated in FIG. 13, inductors 1310 and 1360 are positioned in a side-by-side relationship. As inductor 1310, for example, generates an electromagnetic field due to the application of a voltage potential across inductor 1310, a voltage potential is induced across inductor 1360. The induced voltage potential across inductor 1360 may be stepped up or stepped down from the voltage potential applied across inductor 1310 as desired in designing inductors 1310 and 1360 and in positioning inductors 1310 and 1360 relative to one another.

Each inductor 1310 and 1360 for one embodiment is fabricated similarly as inductor 100. For one embodiment, each inductor 1310 and 1360 is fabricated in accordance with flow diagram 200 of FIG. 2 over the same substrate to form transformer 1300.

For one embodiment where each inductor 1310 and 1360 comprises a first magnetic layer corresponding to magnetic layer 304 of inductor 100, each corresponding first magnetic layer of inductors 1310 and 1360 for one embodiment may be formed at the same time and remain connected to one another to help increase the mutual inductance between inductors 1310 and 1360. For one embodiment where each inductor 1310 and 1360 comprises a second magnetic layer corresponding to magnetic layer 312 of inductor 100, each corresponding second magnetic layer of inductors 1310 and 1360 for one embodiment may be formed at the same time and remain connected to one another to help increase the mutual inductance between inductors 1310 and 1360. For one embodiment where each inductor 1310 and 1360 comprises both magnetic layers corresponding to magnetic layers 304 and 312 of inductor 100, the first magnetic layer of each inductor 1310 and 1360 may be connected to the second magnetic layer of each inductor 1310 and 1360 at one or more regions along a perimeter surrounding both inductors 1310 and 1360 to help further increase the mutual inductance between inductors 1310 and 1360.

Figure 14:
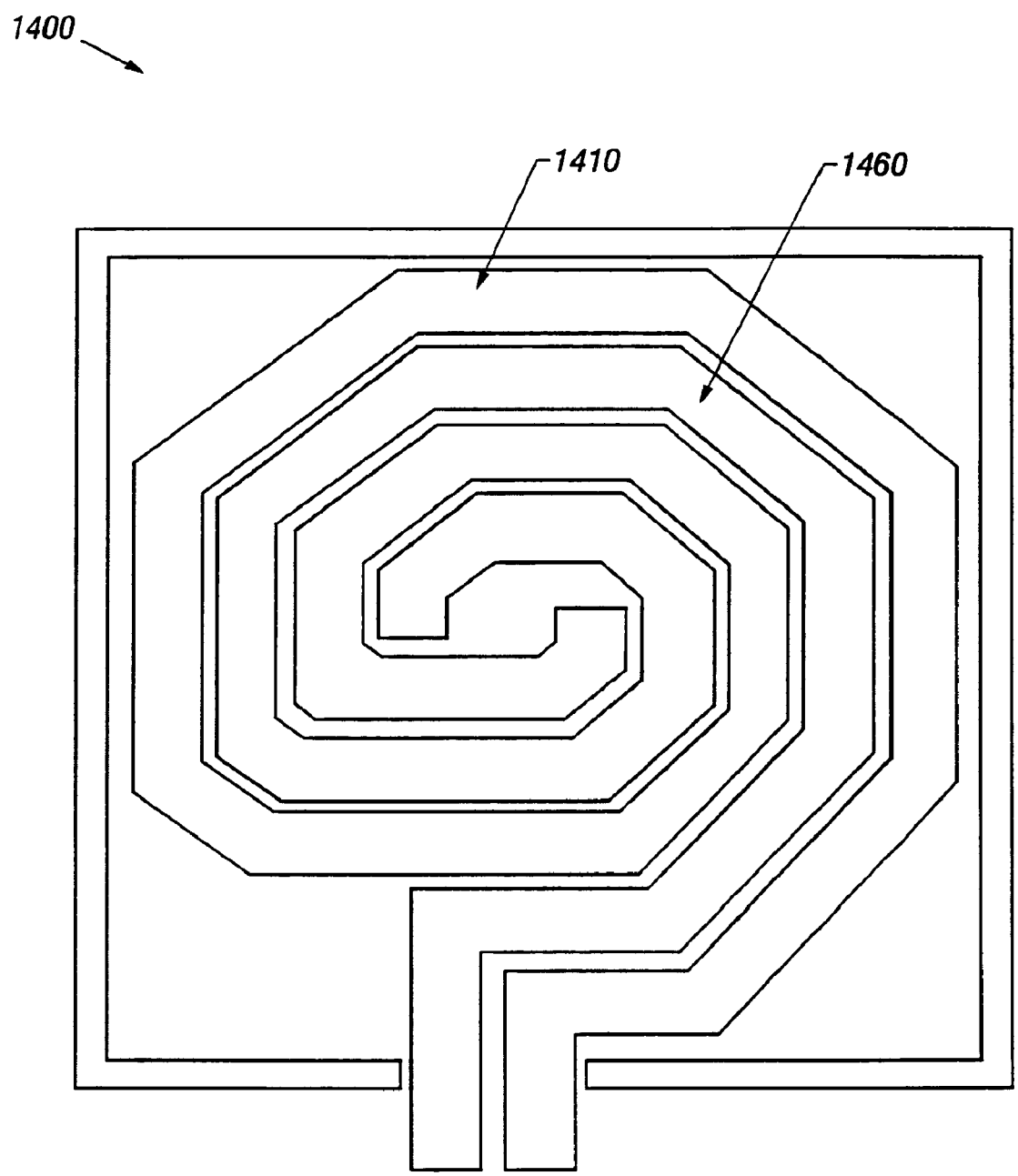
FIG. 14 illustrates, for one embodiment, a plan view of another integrated transformer.

FIG. 14 illustrates, for one embodiment, another integrated transformer 1400. Integrated transformer 1400 comprises integrated inductor 1410 and another integrated inductor 1460. Inductors 1410 and 1460 for one embodiment are positioned such that at least a portion of one or more turns of the conductor of inductor 1460 are each positioned adjacent to an inner side of at least a portion of one turn of the conductor of inductor 1410. Inductors 1410 and 1460 for one embodiment are positioned such that at least a portion of one or more turns of inductor 1410 are each positioned between at least a portion of each of two turns of inductor 1460 and such that at least a portion of one or more turns of inductor 1460 are each positioned between at least a portion of each of two turns of inductor 1410. For one embodiment, as illustrated in FIG. 14, inductors 1410 and 1460 are positioned such that each turn of inductor 1410 is positioned on the same level as and adjacent to at least one turn of inductor 1460 and such that each turn of inductor 1460 is positioned on the same level as and adjacent to at least one turn of inductor 1410.

As inductor 1410, for example, generates an electromagnetic field due to the application of a voltage potential across inductor 1410, a voltage potential is induced across inductor 1460. The induced voltage potential across inductor 1460 may be stepped up or stepped down from the voltage potential applied across inductor 1410 as desired in designing inductors 1410 and 1460 and in positioning inductors 1410 and 1460 relative to one another.

Each inductor 1410 and 1460 for one embodiment is fabricated similarly as inductor 100. For one embodiment, each inductor 1410 and 1460 is fabricated in accordance with flow diagram 200 of FIG. 2. The conductor of each inductor 1410 and 1460, for one embodiment, is formed simultaneously for blocks 212 and 214 of FIG. 2. Transformer 1400 may be formed with a first magnetic layer corresponding to magnetic layer 304 of inductor 100 and/or a second magnetic layer corresponding to magnetic layer 312 of inductor 100.

Although each inductor 100, 1150, 1310, 1360, 1410 and 1460 is described as comprising one single-level spiral-shaped conductor, other suitable primary and secondary inductors each having any suitable number of one or more spiral-shaped conductors each formed over one or more levels and coupled in series or in parallel may be similarly fabricated as inductor 100 and positioned relative to one another in any suitable manner to form an integrated transformer.

Figure 15:
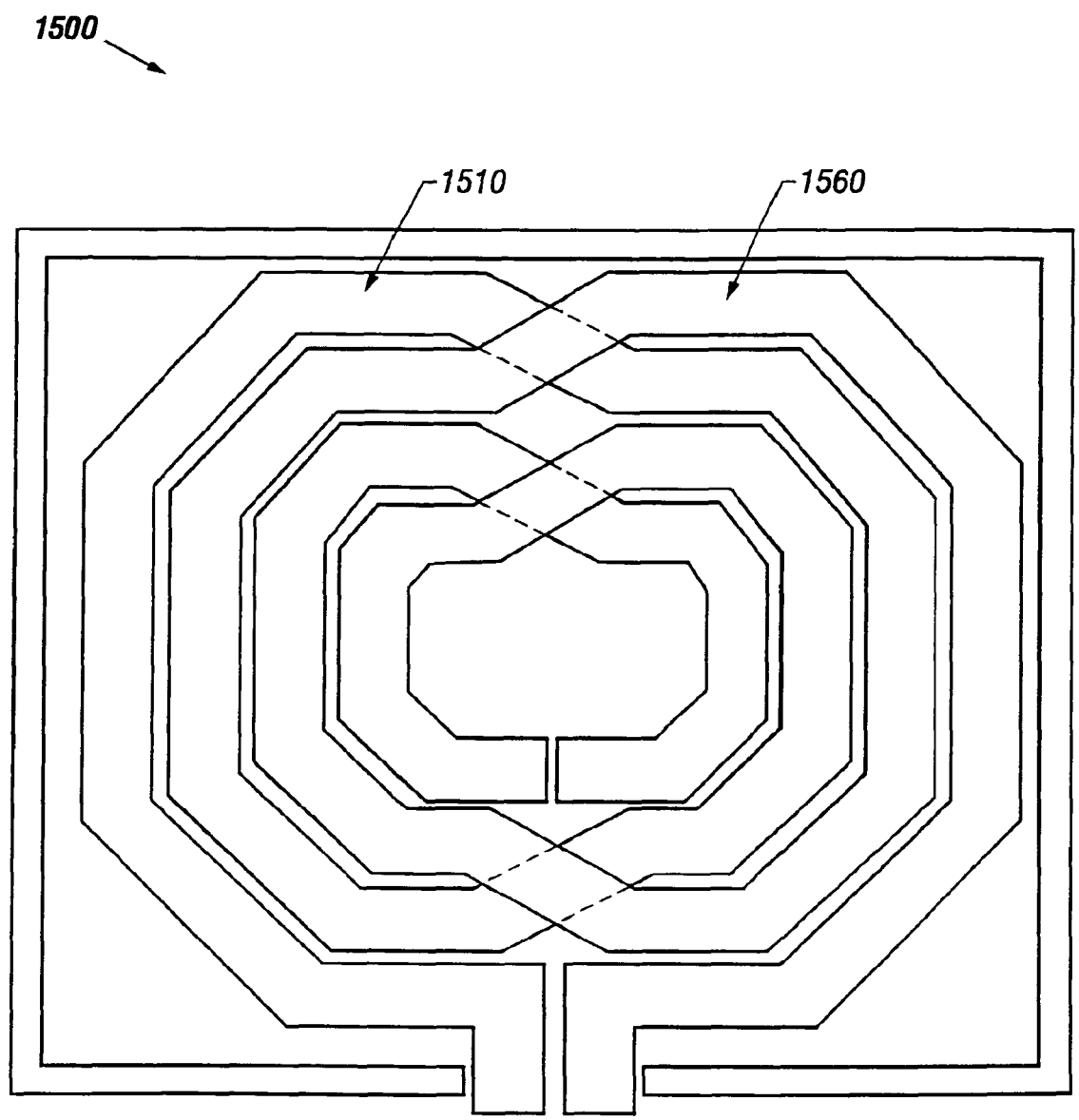
FIG. 15 illustrates, for one embodiment, a plan view of another integrated transformer.

FIG. 15 illustrates, for one embodiment, another integrated transformer 1500. Integrated transformer 1500 comprises integrated inductor 1510 and another integrated inductor 1560. Inductors 1510 and 1560 for one embodiment are positioned such that at least a portion of one or more turns of the conductor of inductor 1560 are each positioned adjacent to an inner side of at least a portion of one turn of the conductor of inductor 1510 and such that at least a portion of one or more turns of inductor 1510 are each positioned adjacent to an inner side of at least a portion of one turn of inductor 1560. Inductors 1510 and 1560 for one embodiment are positioned such that at least a portion of one or more turns of inductor 1510 are each positioned between at least a portion of each of two turns of inductor 1560, such that at least a portion of one or more turns of inductor 1560 are each positioned between at least a portion of each of two turns of inductor 1510, and such that each of one or more turns of inductor 1510 or 1560 crosses over an adjacent turn of inductor 1560 or 1510 at least once.

As inductor 1510, for example, generates an electromagnetic field due to the application of a voltage potential across inductor 1510, a voltage potential is induced across inductor 1560. The induced voltage potential across inductor 1560 may be stepped up or stepped down from the voltage potential applied across inductor 1510 as desired in designing inductors 1510 and 1560 and in positioning inductors 1510 and 1560 relative to one another.

Each inductor 1510 and 1560 for one embodiment is fabricated similarly as inductor 100. For one embodiment, each inductor 1510 and 1560 is fabricated in accordance with flow diagram 200 of FIG. 2. The conductor of each inductor 1510 and 1560, for one embodiment, is formed simultaneously for blocks 212 and 214 of FIG. 2 and spans multiple levels to accommodate cross-overs for each conductor with a suitable dielectric material between each conductor at each cross-over. Transformer 1500 may be formed with a first magnetic layer corresponding to magnetic layer 304 of inductor 100 and/or a second magnetic layer corresponding to magnetic layer 312 of inductor 100.

Although each transformer 1100, 1300, 1400, and 1500 is illustrated as comprising one primary inductor and one secondary inductor, any suitable number of primary and secondary inductors each similarly fabricated as inductor 100 may be positioned relative to one another in any suitable manner to form an integrated transformer. As one example, two secondary inductors may be positioned relative to one primary inductor in any suitable manner to form an integrated transformer.

Integrated Autotransformer Structure

Figure 16:
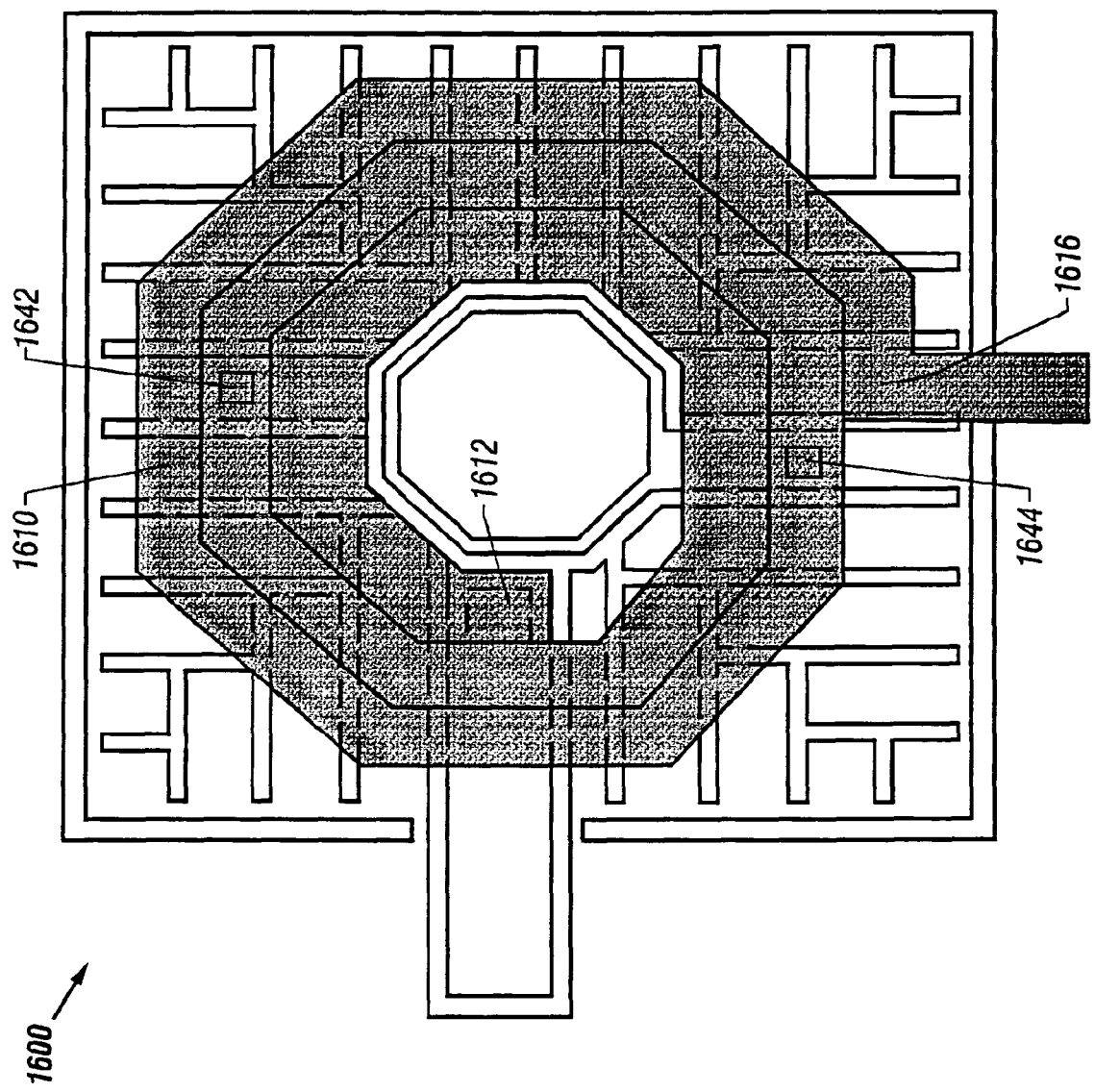
FIG. 16 illustrates, for one embodiment, a plan view of another integrated transformer.

FIG. 16 illustrates, for one embodiment, an integrated transformer 1600. Integrated transformer 1600 is an autotransformer. Transformer 1600 for one embodiment may be similarly fabricated as inductor 100 of FIG. 1, for example. As a voltage potential is applied across a node 1612 near one end of a spiral-shaped conductor 1610 of transformer 1600 and another node 1616 near the other end of conductor 1610, a voltage potential between any two points along conductor 1610 may be tapped. Transformer 1600 may be used, for example, for circuits such as in a direct current (dc) voltage converter.

FIG. 16 illustrates, for one embodiment, voltage taps 1642 and 1644 each at a node between nodes 1612 and 1616. A voltage potential tapped using voltage taps 1642 and/or 1644 may be stepped down from the voltage potential applied across transformer 1600 as desired in designing transformer 1600. The resulting voltage potential, for example, across voltage tap 1642 and voltage tap 1644, node 1612 and voltage tap 1642, node 1612 and voltage tap 1644, node 1616 and voltage tap 1642, and/or node 1616 and voltage tap 1644 may be tapped.

For another embodiment, a predetermined voltage potential, such as ground for example, may be applied to voltage tap 1642 and/or voltage tap 1644. As a voltage potential is applied across transformer 1600, the resulting voltage potential across node 1612 and voltage tap 1642, node 1612 and voltage tap 1644, node 1616 and voltage tap 1642, and/or node 1616 and voltage tap 1644 may be tapped.

Although conductor 1610 is illustrated as defining approximately 2¾ generally octagonal-shaped turns, conductor 1610 may define any suitable number of one or more turns and any suitable fraction of a turn of any suitable shape. Each turn may be rectangular, hexagonal, or circular in shape, for example. The number of turns defined by conductor 1610 helps determine the amount of the voltage potential tapped using voltage taps 1642 and/or 1644 for a given voltage potential applied across transformer 1600. The shape of each turn for conductor 1610 may also help determine the amount of the voltage potential tapped using voltage taps 1642 and/or 1644 for a given voltage potential applied across transformer 1600.

Conductor 1610 may comprise any suitable conductive material and may have any suitable dimensions. The signal path defined by conductor 1610 may have any suitable width, thickness, and length with any suitable spacing between turns and may cover an area of any suitable shape and size. The material and dimensions of conductor 1610 and the spacing between turns for conductor 1610 may help determine the amount of the voltage potential tapped using voltage taps 1642 and/or 1644 for a given voltage potential applied across transformer 1600.

Transformer 1600 may be fabricated such that a voltage potential may be tapped from conductor 1610 in any suitable manner. Transformer 1600 may be fabricated, for example, such that a voltage potential may be tapped from beneath conductor 1610 and/or from above conductor 1610. Voltage taps 1642 and 1644, for example, may be conductively coupled to circuitry from beneath and/or above transformer 1600 by forming a respective via to conductor 1610 and filling the via with a suitable conductive material. Where transformer 1600 comprises a lower magnetic layer and/or an upper magnetic layer, a portion of the lower magnetic layer and/or the upper magnetic layer may optionally be isolated to serve as a portion of a conductive contact to conductor 1610.

Although transformer 1600 is described as comprising one single-level spiral-shaped conductor, any other suitable transformer having any suitable number of one or more spiral-shaped conductors each formed over one or more levels and coupled in series or in parallel may be similarly fabricated and tapped at any suitable location along any conductor of the transformer.

Although transformer 1600 is illustrated in the context of a single inductor, any suitable primary or secondary inductor of any suitable transformer, such as transformer 1100 of FIG. 11, transformer 1300 of FIG. 13, transformer 1400 of FIG. 14, or transformer 1500 of FIG. 15, for example, may be tapped at any suitable location along any conductor of the transformer.

Integrated Circuit and Integrated Circuit Package

Figure 17:
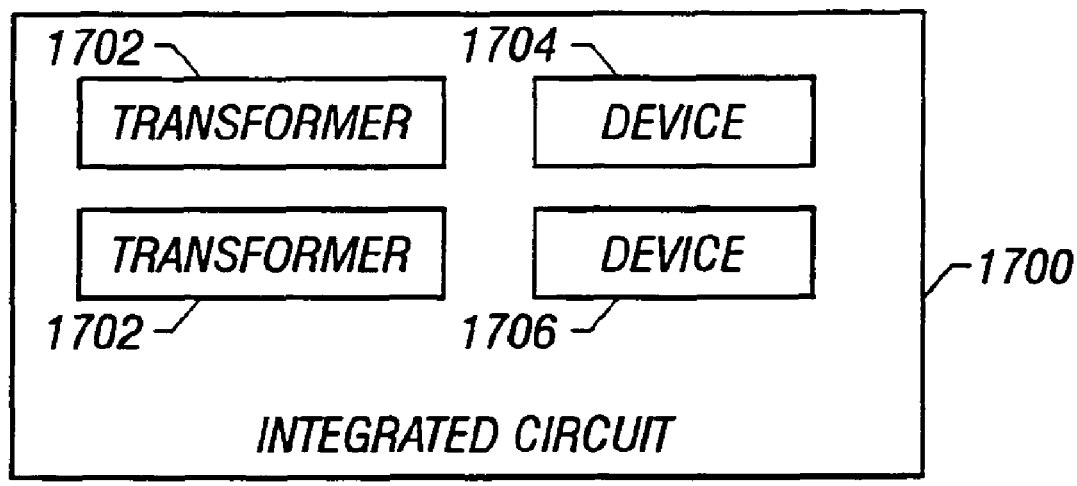
FIG. 17 illustrates, for one embodiment, a block diagram of an integrated circuit comprising one or more transformers.

As illustrated in block diagram form in FIG. 17, one or more integrated transformers 1702 may be integrated in an integrated circuit 1700 with any suitable one or more integrated circuit devices, such as integrated circuit devices 1704 and 1706 for example, or with any suitable circuits comprising one or more integrated circuit devices, such as integrated circuit devices 1704 and 1706 for example. Each transformer 1702 may be fabricated, for example, as transformer 1100 of FIG. 11, transformer 1300 of FIG. 13, transformer 1400 of FIG. 14, transformer 1500 of FIG. 15, or transformer 1600 of FIG. 16. Although illustrated as comprising two transformers 1702, integrated circuit 1700 may be fabricated with any suitable number of one or more transformers 1702.

Figure 18:
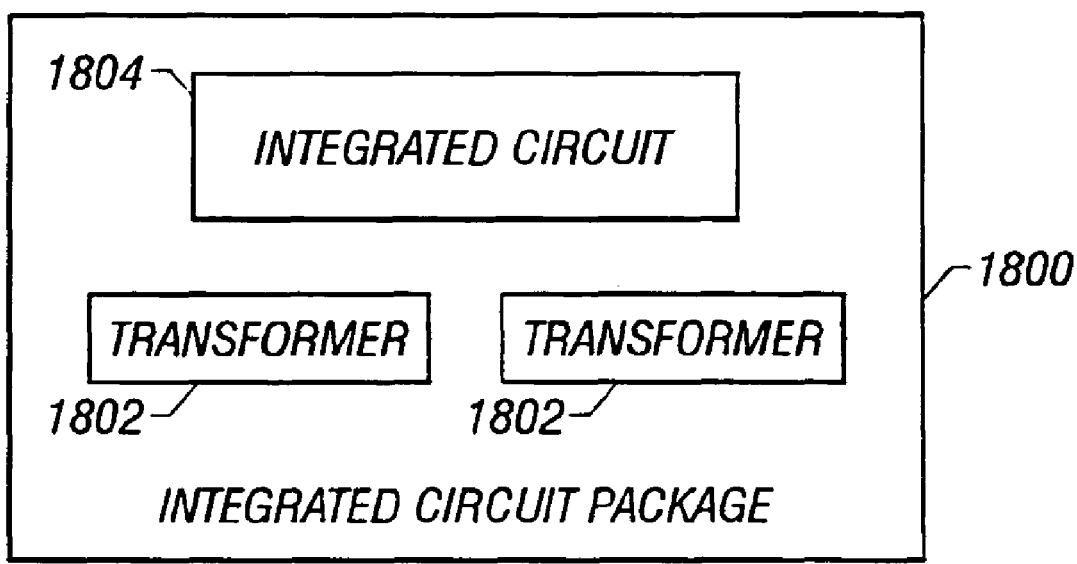
FIG. 18 illustrates, for one embodiment, a block diagram of an integrated circuit package comprising one or more transformers.

As illustrated in block diagram form in FIG. 18, one or more integrated transformers 1802 for one embodiment may be mounted in an integrated circuit package 1800 for conductive coupling to an integrated circuit 1804 housed by integrated circuit package 1800. Each transformer 1802 may be integrated with or mounted in integrated circuit package 1800 and conductively coupled to integrated circuit 1804 in any suitable manner. Each transformer 1802 may be fabricated, for example, as transformer 1100 of FIG. 11, transformer 1300 of FIG. 13, transformer 1400 of FIG. 14, transformer 1500 of FIG. 15, or transformer 1600 of FIG. 16. Although illustrated as comprising two transformers 1802, integrated circuit package 1800 may be fabricated with any suitable number of one or more transformers 1802. Also, one or more transformers 1802 may be fabricated directly on an integrated circuit package.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A transformer comprising:
a substrate comprising a semiconductor material;
a first conductor over the substrate, the first conductor defining a first generally spiral-shaped signal path having at least one turn, the first spiral-shaped signal path having a first end and a second end;
a second conductor over the substrate, the second conductor defining a second generally spiral-shaped signal path having at least one turn, the second spiral-shaped signal path having a third end and a fourth end, wherein at least a portion of an innermost turn of the first conductor at the first end of the first spiral-shaped signal path is positioned adjacent to at least a portion of an innermost turn of the second conductor at the third end of the second spiral-shaped signal path; and
a first magnetic layer between the substrate and the conductors.

2. The transformer of claim 1, wherein the at least one turn of the first conductor is positioned on the same level as the at least one turn of the second conductor.

3. The transformer of claim 1, comprising at least one slot in the first magnetic layer.

4. The transformer of claim 1, further comprising
a second magnetic layer over the conductors.

5. The transformer of claim 1, wherein the at least one turn of the first conductor crosses over the at least one turn of the second conductor.

6. The transformer of claim 1, wherein the magnetic layer comprises cobalt.

* * * * *